United States Patent
Min et al.

(10) Patent No.: US 8,466,256 B2
(45) Date of Patent: Jun. 18, 2013

(54) POLYMER, ORGANIC PHOTOELECTRONIC DEVICE, AND DISPLAY INCLUDING THE SAME

(75) Inventors: Soo-Hyun Min, Uiwang-si (KR); Eun-Sun Yu, Uiwang-si (KR); Dal-Ho Huh, Uiwang-si (KR); Mi-Young Chae, Uiwang-si (KR); Ho-Jae Lee, Uiwang-si (KR); Young-Hoon Kim, Uiwang-si (KR); Ja-Hyun Kim, legal representative, Bryeong (KR)

(73) Assignee: Cheil Industries, Inc., Gumi-si, Kyeongsangbuk-do (KR)

( * ) Notice: Subject to any disclaimer, the term of this patent is extended or adjusted under 35 U.S.C. 154(b) by 0 days.

(21) Appl. No.: 13/167,173

(22) Filed: Jun. 23, 2011

(65) Prior Publication Data
US 2011/0303908 A1 Dec. 15, 2011

Related U.S. Application Data

(63) Continuation of application No. PCT/KR2009/007410, filed on Dec. 10, 2009.

(30) Foreign Application Priority Data

Dec. 24, 2008 (KR) .................. 10-2008-0133695
Dec. 26, 2008 (KR) .................. 10-2008-0134873

(51) Int. Cl.
*C08G 73/06* (2006.01)
*C08G 73/00* (2006.01)

(52) U.S. Cl.
USPC ........... 528/422; 528/423; 528/424; 528/396; 428/690; 428/917

(58) Field of Classification Search
USPC .................. 528/423, 422, 424, 396; 428/690, 428/917
See application file for complete search history.

(56) References Cited

U.S. PATENT DOCUMENTS

2004/0110958 A1 6/2004 Nishiyama et al.

FOREIGN PATENT DOCUMENTS

| EP | 1400578 A1 | 3/2004 |
|---|---|---|
| KR | 10-2004-0025826 A | 3/2004 |
| KR | 10-2005-0053562 A | 6/2005 |
| KR | 10-2005-0067649 A | 7/2005 |
| KR | 10-2008-0104997 A | 12/2008 |
| TW | I292430 B | 1/2008 |

OTHER PUBLICATIONS

Nishiyama et al; Preparation of high purity arylamines having fluorenyl groups; Jun. 2005; Tosho Corp., Japan; Chem Abstract 143: 59687.*
Taiwanese Search Report in TW 098144449, dated Nov. 21, 2012 (Min, et al.).
PCT Search Report in Parent PCT/KR2009/007410, Dec. 10, 2009.

\* cited by examiner

*Primary Examiner* — Duc Truong
(74) *Attorney, Agent, or Firm* — Lee & Morse, P.C.

(57) ABSTRACT

A polymer, an organic photoelectric device, and a display device, the polymer including a repeating unit represented by the following Chemical Formula 1:

[Chemical Formula 1]

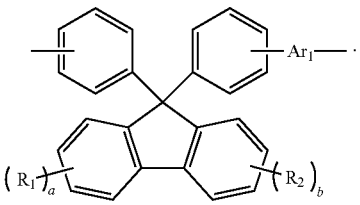

13 Claims, 10 Drawing Sheets

FIG. 12

Table 1

| | Polymer | Turn-on voltage (V) | Luminance (at 1000cd/m²) | | | | | Color coordinate (x, y) |
| --- | --- | --- | --- | --- | --- | --- | --- | --- |
| | | | Driving voltage (V) | Light emitting efficiency (cd/A) | Electrical power efficiency (lm/W) | Max light emitting efficiency (cd/A) | Max electrical power efficiency (lm/W) | |
| Comparative Example 1 | None | 4.8 | 8.34 | 16.97 | 6.39 | 19.2 | 6.8 | 0.312, 0.612 |
| Example 8 | Example 1 | 4.4 | 6.9 | 22 | 10.0 | 26.6 | 10.5 | 0.316, 0.614 |
| Example 9 | Example 3 | 4.0 | 7.2 | 18.8 | 8.2 | 23.6 | 8.5 | 0.324, 0.610 |

POLYMER, ORGANIC PHOTOELECTRONIC DEVICE, AND DISPLAY INCLUDING THE SAME

CROSS-REFERENCE TO RELATED APPLICATION

This application is a continuation of pending International Application No. PCT/KR2009/007410, entitled "Polymer, Organic Photoelectronic Device and Display Including the Same," which was filed on Dec. 10, 2009, the entire contents of which are hereby incorporated by reference.

BACKGROUND

1. Field

Embodiments relates to a polymer, an organic photoelectric device, and a display device including the same.

2. Description of the Related Art

A photoelectric device is, in a broad sense, a device for transforming photo-energy to electrical energy, and conversely, for transforming electrical energy to photo-energy. For example, among photoelectric devices, an organic light emitting device employing organic light emitting diodes (OLED) has recently drawn attention due to the increase in demand for flat panel displays.

The organic light emitting diode has a structure in which a functional organic material layer is interposed between an anode and a cathode. The organic thin layer may include, e.g., an emission layer, a hole injection layer (HIL), a hole transport layer (HTL), an electron transport layer (ETL), an electron injection layer (EIL), and the like, and may further include an electron blocking layer or a hole blocking layer in terms of light emitting properties of the emission layer.

Generally, an organic light emitting diode (OLED) is fabricated by vacuum deposition using a fine metal mask as a patterning technique. However, such vacuum deposition may have a limit for large-sized display application due to high process cost and technical limitations. Therefore, various patterning techniques have been developed in order to replace the vacuum deposition. For example, a wet process such as spin coating, inkjet printing, casting, and the like may not require vacuum technology. Thus, it has drawn attention in the large-sized display industry since the cost is reduced and the device is easily fabricated without losing material.

However, with materials applied by a wet process, it may be difficult to achieve excellent device performance compared to materials applied by vacuum deposition. In addition, when an organic thin layer is formed by a wet process, the material of an earlier formed lower layer may be eluted by the organic solvent. Accordingly, it may be difficult to stack the organic thin layers into multi-layers.

SUMMARY

Embodiments are directed to a polymer, an organic photoelectric device, and a display device including the same.

The embodiments may be realized by providing a polymer including a repeating unit represented by the following Chemical Formula 1:

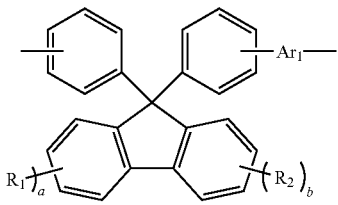

[Chemical Formula 1]

wherein, in the above Chemical Formula 1, $Ar_1$ is a divalent organic group including one of a C1 to C60 substituted or unsubstituted alkylene group, a nitrogen-containing C1 to C60 substituted or unsubstituted heteroalkylene group, a C6 to C60 substituted or unsubstituted arylene group, a nitrogen-containing C3 to C60 substituted or unsubstituted heteroarylene group, and a C6 to C60 substituted or unsubstituted arylamine group, $R_1$ and $R_2$ are each independently one of hydrogen, a C1 to C30 substituted or unsubstituted alkyl group, and a C6 to C30 substituted or unsubstituted aryl group, and a and b are each independently integers of 0 to 4.

$Ar_1$ may be a substituent represented by one of the following Chemical Formulae 2 to 5:

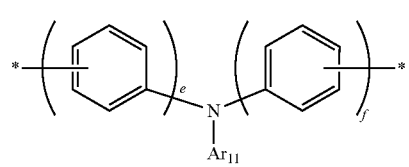

[Chemical Formula 2]

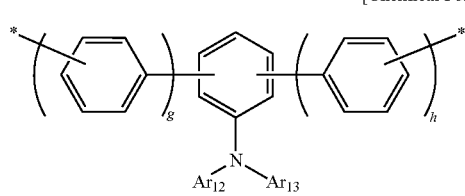

[Chemical Formula 3]

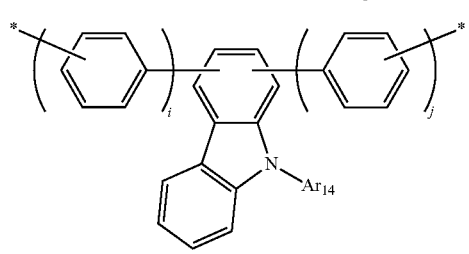

[Chemical Formula 4]

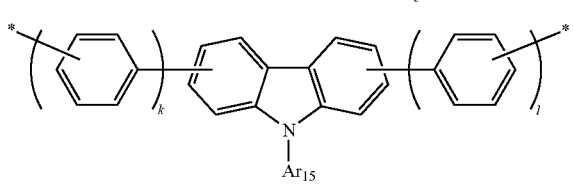

[Chemical Formula 5]

wherein, in the above Chemical Formulae 2 to 5, $Ar_{11}$ to $Ar_{15}$ may each independently be one of hydrogen, a halogen, a cyano group, a hydroxyl group, an amino group, a nitro group, a carboxyl group, a substituted or unsubstituted C1 to C20 alkyl group, a substituted or unsubstituted C2 to C50 alkenyl group, a substituted or unsubstituted C3 to C50 cycloalkyl group, a substituted or unsubstituted C1 to C50 heterocycloalkyl group, a substituted or unsubstituted C6 to C50 aryl group, a substituted or unsubstituted C3 to C50 heteroaryl group, a substituted or unsubstituted C6 to C50 arylamine group, a substituted or unsubstituted C1 to C50 alkoxy group, a substituted or unsubstituted C6 to C50 aryloxy group, a substituted or unsubstituted C2 to C50 heteroaryloxy group, a substituted or unsubstituted C3 to C50 silyloxy group, a substituted or unsubstituted C1 to C50 acyl group, a substituted or unsubstituted C2 to C50 alkoxycarbonyl group, a substituted or unsubstituted C2 to C50 acyloxy group, a substituted or unsubstituted C2 to C50 acylamino group, a substituted or unsubstituted C2 to C50 alkoxycarbonylamino group, a substituted or unsubstituted C7 to C50 aryloxycarbonylamino group, a substituted or unsubstituted C1 to C50 sulfamoylamino group, a substituted or unsubstituted C1 to C50 sulfonyl group, a substituted or unsubstituted C1 to C50 alkylthiol group, a substituted or unsubstituted C6 to C50 arylthiol group, a substituted or unsubstituted C1 to C50 heterocycloalkylthiol group, a substituted or unsubstituted C1 to C50 ureide group, a substituted or unsubstituted C1 to C50 phosphoric acid amide group, a substituted or unsubstituted C3 to C50 silyl group, and fused rings thereof, and e, f, g, h, i, j, k, and l may each independently be an integer of 0 to 4.

$Ar_{11}$ to $Ar_{15}$ may each independently be one of a substituted or unsubstituted C3 to C30 cycloalkyl group, a substituted or unsubstituted C1 to C30 heterocycloalkyl group, a substituted or unsubstituted C6 to C30 aryl group, a substituted or unsubstituted C3 to C30 heteroaryl group, a substituted or unsubstituted C6 to C30 arylamine group, and fused rings thereof.

$Ar_1$ may be a substituent represented by one of the following Chemical Formulae 19 and 20:

[Chemical Formula 19]

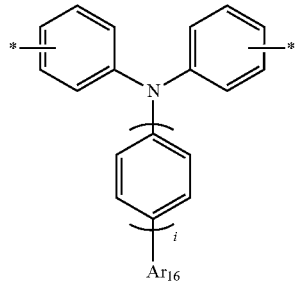

[Chemical Formula 20]

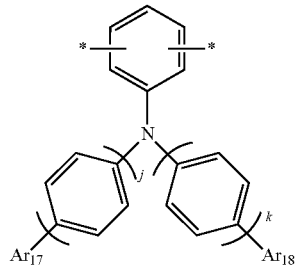

wherein, in the above Chemical Formulae 19 and 20, $Ar_{16}$ to $Ar_{18}$ may each independently be one of hydrogen, a substituted or unsubstituted phenyl group, a substituted or unsubstituted biphenyl group, a substituted or unsubstituted terphenyl group, a substituted or unsubstituted fluorene group, a substituted or unsubstituted carbazole group, a substituted or unsubstituted benzimidazole group, and a substituted or unsubstituted arylamine group, and i, j, and k may each independently be 0 or 1.

The polymer may further include a cross-linkable functional group at a terminal end thereof.

The cross-linkable functional group may include one of a substituted or unsubstituted alkenyl group, a substituted or unsubstituted (meth)acryl group, a substituted or unsubstituted epoxy group, a substituted or unsubstituted styrene group, and a substituted or unsubstituted alkoxy group.

The polymer may have a difference of about 2.4 eV or more between a highest occupied molecular orbital (HOMO) and a lowest unoccupied molecular orbital (LUMO).

The repeating unit represented by Chemical Formula 1 may be one of the following Chemical Formulae 6 to 18:

[Chemical Formula 6]

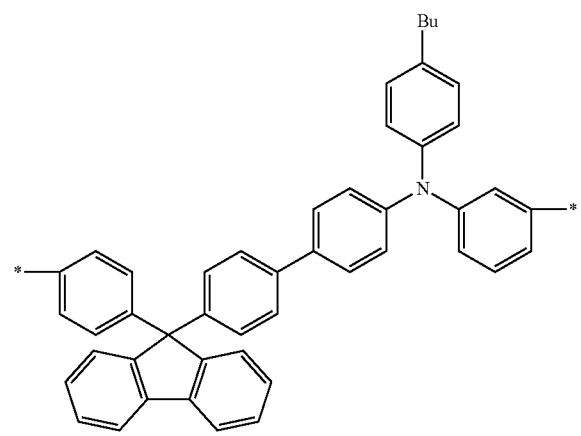

[Chemical Formula 7]

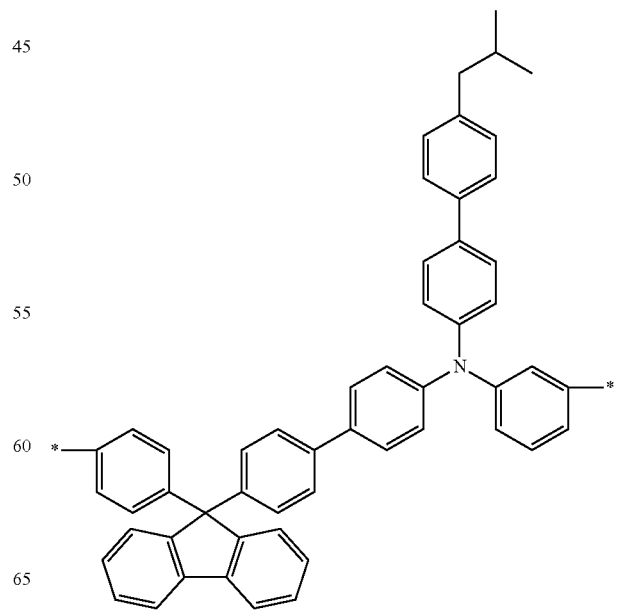

[Chemical Formula 8]
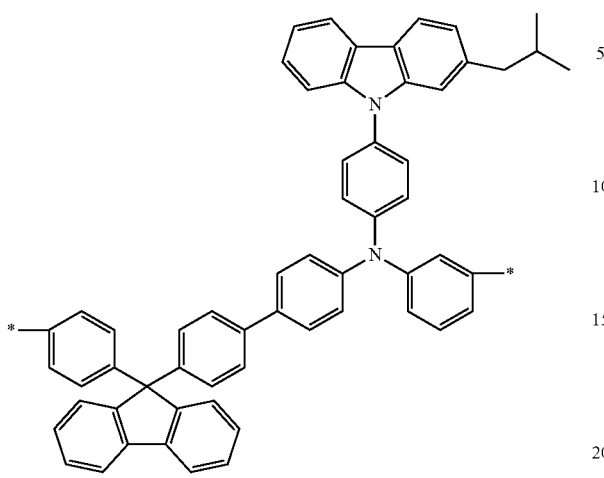
[Chemical Formula 9]
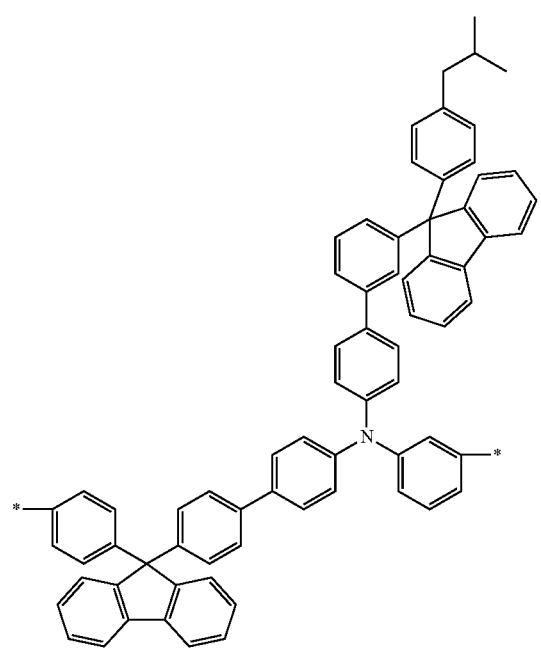
[Chemical Formula 10]
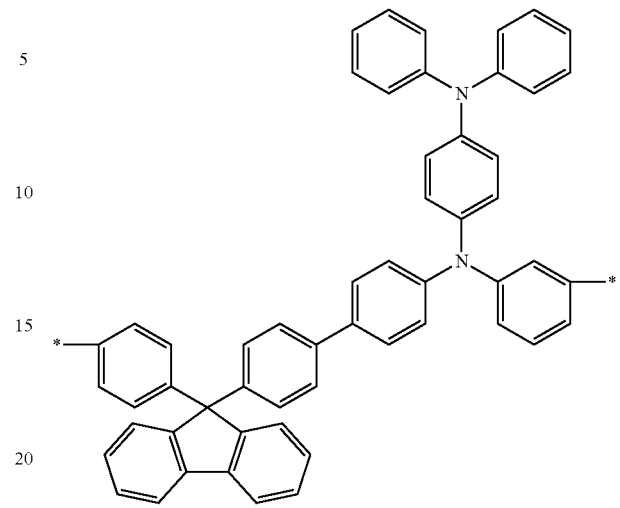
[Chemical Formula 11]
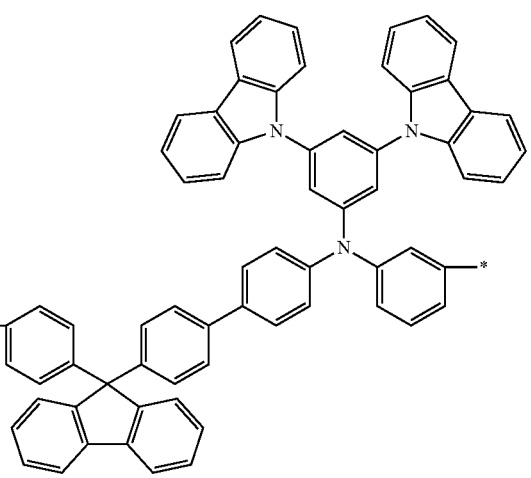
[Chemical Formula 12]
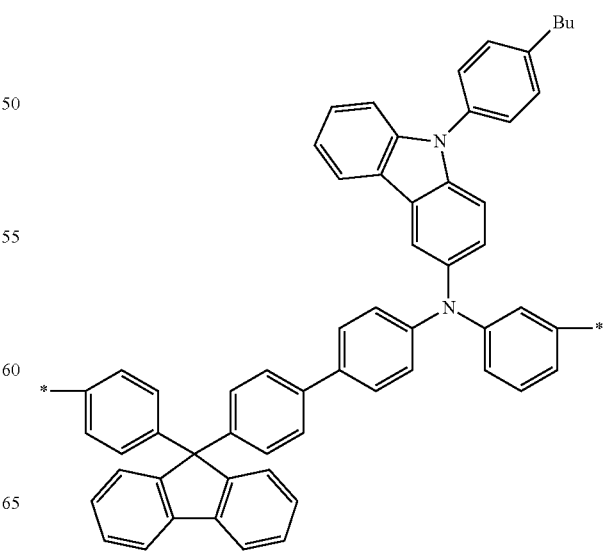

[Chemical Formula 13]

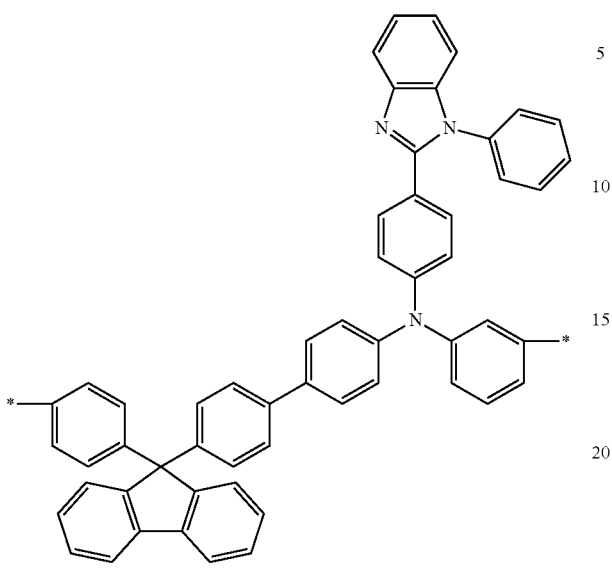

[Chemical Formula 14]

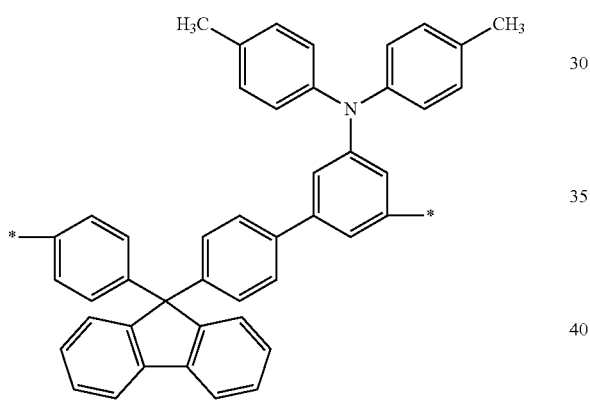

[Chemical Formula 15]

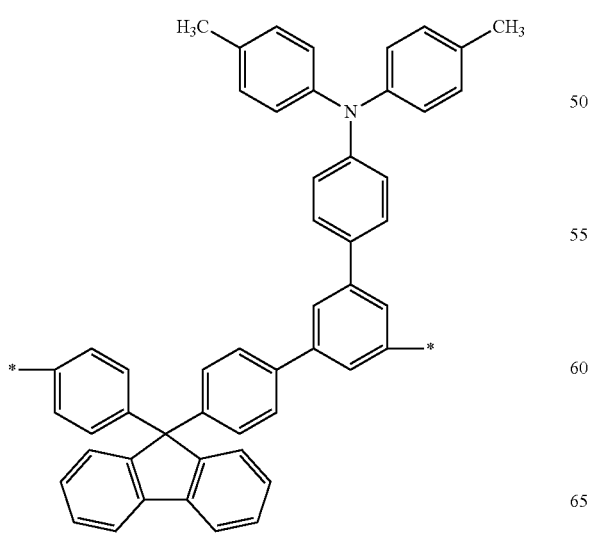

[Chemical Formula 16]

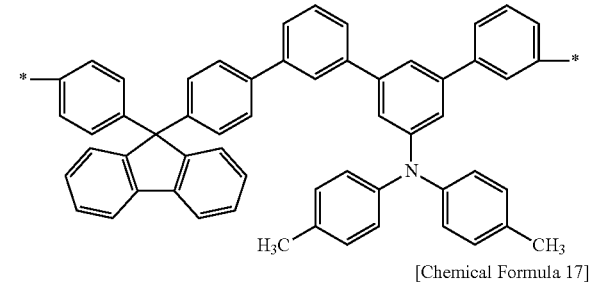

[Chemical Formula 17]

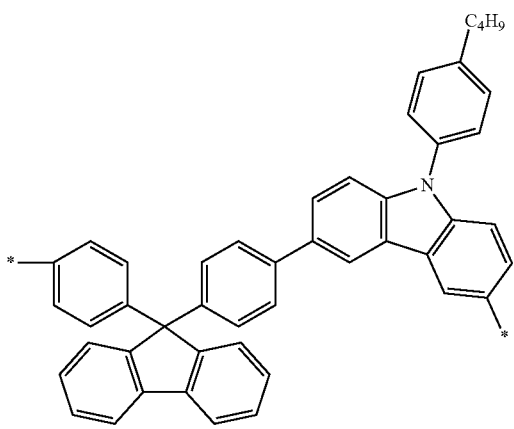

[Chemical Formula 18]

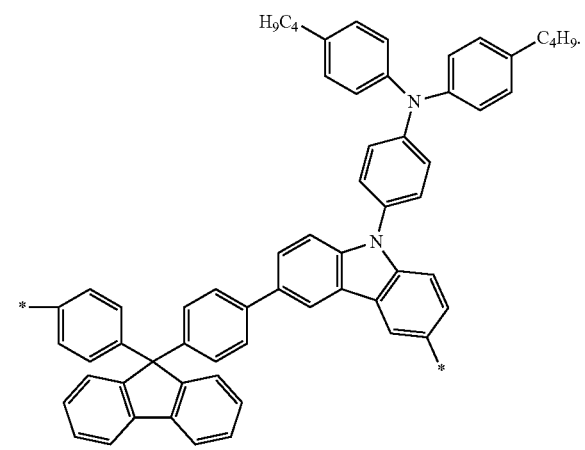

The embodiments may also be realized by providing an organic photoelectric device including an anode, a cathode, and at least one organic thin layer between the anode and cathode, the organic thin layer including the polymer of an embodiment.

The polymer may be a host material or a charge-transporting material.

The polymer may be included in a hole transport layer.

The organic thin layer may be an emission layer, a hole transport layer (HTL), a hole injection layer (HIL), a hole inhibition layer, an electron transport layer (ETL), an electron injection layer (EIL), an electron inhibition layer, or a combination thereof.

The embodiments may also be realized by providing a display device including the organic photoelectric device of an embodiment.

BRIEF DESCRIPTION OF THE DRAWINGS

The embodiments will become more apparent to those of ordinary skill in the art by describing in detail exemplary embodiments with reference to the attached drawings, in which:

FIG. 12 illustrates Table 1 showing analysis results for organic photoelectric devices prepared according to Examples 8 and 9 as well as Comparative Example 1.

DETAILED DESCRIPTION

Figure 1:
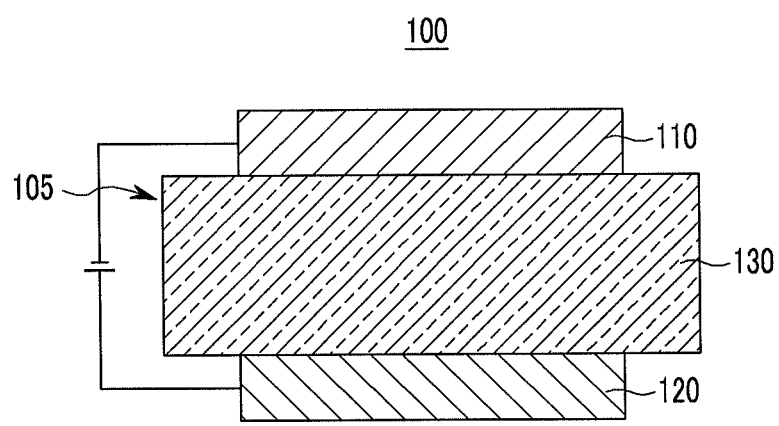
FIGS. 1 to 5 illustrate cross-sectional views of organic photoelectric devices including polymers according to various embodiments.

Korean Patent Application No. 10-2008-0133695, filed on Dec. 24, 2008, and Korean Patent Application No. 10-2008-0134873, filed on Dec. 26, 2008, in the Korean Intellectual Property Office, and entitled: "Polymer, Organic Photoelectronic Device and Display Including the Same," are incorporated by reference herein in their entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. In addition, it will also be understood that when a layer is referred to as being "between" two layers, it can be the only layer between the two layers, or one or more intervening layers may also be present. Like reference numerals refer to like elements throughout.

As used herein, when specific definition is not otherwise provided, the term "substituted" may refer to one substituted with at least one of a C1 to C60 alkyl group, a C2 to C60 alkenyl group, a C3 to C60 cycloalkyl group, a C1 to C60 heterocycloalkyl group, a C6 to C60 aryl group, a C3 to C60 heteroaryl group, and a C6 to C60 arylamine group.

As used herein, when specific definition is not otherwise provided, the term "hetero" may refer to one including N, O, S, Si, or P, and remaining carbons in one ring.

An embodiment provides a polymer including a repeating unit represented by the following Chemical Formula 1.

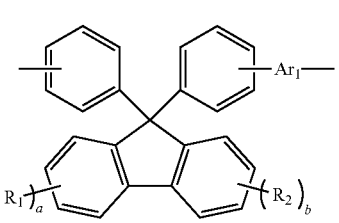

[Chemical Formula 1]

In the above Chemical Formula 1,

Ar$_1$ may be a divalent organic group including one of a C1 to C60 substituted or unsubstituted alkylene group, a nitrogen-containing C1 to C60 substituted or unsubstituted heteroalkylene group, a C6 to C60 substituted or unsubstituted arylene group, a nitrogen-containing C3 to C60 substituted or unsubstituted heteroarylene group, and a C6 to C60 substituted or unsubstituted arylamine group, R$_1$ and R$_2$ may each independently be one of hydrogen, a C1 to C30 substituted or unsubstituted alkyl group, and a C6 to C30 substituted or unsubstituted aryl group, and a and b may each independently be integers of 0 to 4. In an implementation, a and b may each independently be integers of 1 to 4.

For example, when a is an integer of 2 or more, each R$_1$ may be different; and when b is an integer of 2 or more, each R$_2$ may be different.

A comparative polymer may have a structure in which a repeating unit is connected at positions on the fluorene moiety analogous to R$_1$ and R$_2$ of Chemical Formula 1. A conjugation length of polymer may be proportionally increased between repeating units according to an increase of polymerization degree. Generally, a polymer may have various molecular weights and molecular weight distributions, so it may have various energy levels and energy band gaps, even if the polymer is synthesized according to the same reaction. Accordingly, device performance may be deteriorated due to the energy level distribution and the energy band gap distribution when the polymer is applied to an organic photoelectric device.

In comparison, the polymer including a repeating unit represented by Chemical Formula 1 according to the present embodiment may be advantageous in that the conjugated length may not increase, even in the case of increasing the polymer by increasing the polymerization degree chain, because the conjugated length may be controlled by Ar$_1$. Accordingly, it is possible to synthesize a polymer having a desirable energy band gap, which is a desirable difference between HOMO (highest occupied molecular orbital) and LUMO (lowest unoccupied molecular orbital). In addition, it is possible to enhance layer interface stability by providing a cross-linkable functional group at a terminal end of the polymer to form a cross-linking bond in the organic thin layer.

In an implementation, Ar$_1$ of the polymer may be a divalent organic group including one of a nitrogen-containing C1 to C60 substituted or unsubstituted heteroalkylene group, a nitrogen-containing C3 to C60 substituted or unsubstituted heteroarylene group, and a C6 to C60 substituted or unsubstituted arylamine group.

Ar$_1$ of the polymer may improve electron transporting characteristics by introducing a fused ring of a heterocycloalkyl group and an aryl group, e.g., a benzimidazole derivative, as a substituent. Hole transporting characteristics may also be improved by introducing an arylamine fused ring, e.g., a carbazole group, as a substituent.

$Ar_1$ of the polymer may be a substituent represented by one of the following Chemical Formulae 2 to 5.

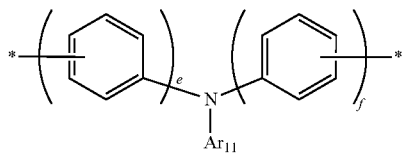

[Chemical Formula 2]

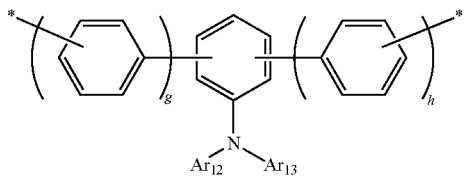

[Chemical Formula 3]

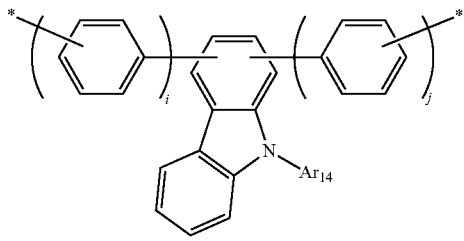

[Chemical Formula 4]

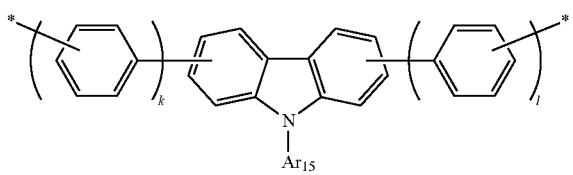

[Chemical Formula 5]

In the above Chemical Formulae 2 to 5, $Ar_{11}$ to $Ar_{15}$ may each independently be one of hydrogen, a halogen, a cyano group, a hydroxy group, an amino group, a nitro group, a carboxyl group, a substituted or unsubstituted C1 to C50 alkyl group, for example a substituted or unsubstituted C1 to C20 alkyl group, a substituted or unsubstituted C2 to C50 alkenyl group, e.g., a substituted or unsubstituted C2 to C20 alkenyl group, a substituted or unsubstituted C3 to C50 cycloalkyl group, for example a substituted or unsubstituted C3 to C30 cycloalkyl group, a substituted or unsubstituted C1 to C50 heterocycloalkyl group, for example substituted or unsubstituted C1 to C30 heterocycloalkyl group, a substituted or unsubstituted C6 to C50 aryl group, for example a substituted or unsubstituted C6 to C30 aryl group, a substituted or unsubstituted C3 to C50 heteroaryl group, for example a substituted or unsubstituted C3 to C30 heteroaryl group, a substituted or unsubstituted C6 to C50 arylamine group, for example a substituted or unsubstituted C6 to C30 arylamine group, a substituted or unsubstituted C1 to C50 alkoxy group, for example a substituted or unsubstituted C1 to C20 alkoxy group, a substituted or unsubstituted C6 to C50 aryloxy group, for example a substituted or unsubstituted C6 to C20 aryloxy group, a substituted or unsubstituted C2 to C50 heteroaryloxy group, for example a substituted or unsubstituted C2 to C20 heteroaryloxy group, a substituted or unsubstituted C3 to C50 silyloxy group, for example a substituted or unsubstituted C3 to C40 silyloxy group, a substituted or unsubstituted C1 to C50 acyl group, for example a substituted or unsubstituted C1 to C20 acyl group, a substituted or unsubstituted C2 to C50 alkoxycarbonyl group, for example a substituted or unsubstituted C2 to C20 alkoxycarbonyl group, a substituted or unsubstituted C2 to C50 acyloxy group, for example a substituted or unsubstituted C2 to C20 acyloxy group, a substituted or unsubstituted C2 to C50 acylamino group, for example a substituted or unsubstituted C2 to C20 acylamino group, a substituted or unsubstituted C2 to C50 alkoxycarbonylamino group, for example a substituted or unsubstituted C2 to C20 alkoxycarbonylamino group, a substituted or unsubstituted C7 to C50 aryloxycarbonylamino group, for example a substituted or unsubstituted C7 to C20 aryloxycarbonylamino group, a substituted or unsubstituted C1 to C50 sulfamoylamino group, for example a substituted or unsubstituted C1 to C20 sulfamoylamino group, a substituted or unsubstituted C1 to C50 sulfonyl group, for example a substituted or unsubstituted C1 to C20 sulfonyl group, a substituted or unsubstituted C1 to C50 alkylthiol group, for example, a substituted or unsubstituted C1 to C20 alkylthiol group, a substituted or unsubstituted C6 to C50 arylthiol group, for example a substituted or unsubstituted C6 to C20 arylthiol group, a substituted or unsubstituted C1 to C50 heterocycloalkylthiol group, for example, a substituted or unsubstituted C1 to C20 heterocycloalkylthiol group, a substituted or unsubstituted C1 to C50 ureide group, for example a substituted or unsubstituted C1 to C20 ureide group, a substituted or unsubstituted C1 to C50 phosphoric acidamide group, for example a substituted or unsubstituted C1 to C20 phosphoric acid amide group, a substituted or unsubstituted C3 to C50 silyl group, for example a substituted or unsubstituted C3 to C40 silyl group, and fused rings thereof, and e, f, g, h, i, j, k, and l may each independently be an integer of 0 to 4.

In the above Chemical Formulae 2 to 5, when $Ar_{11}$ to $Ar_{15}$ are each independently one of a substituted or unsubstituted C3 to C50 cycloalkyl group, for example a substituted or unsubstituted C3 to C30 cycloalkyl group, a substituted or unsubstituted C1 to C50 heterocycloalkyl group, for example a substituted or unsubstituted C1 to 30 heterocycloalkyl group, a substituted or unsubstituted C6 to C50 aryl group, for example a substituted or unsubstituted C6 to C30 aryl group, a substituted or unsubstituted C3 to C50 heteroaryl group, for example a substituted or unsubstituted C3 to C30 heteroaryl group, a substituted or unsubstituted C6 to C50 arylamine group, for example a substituted or unsubstituted C6 to C30 arylamine group, and fused rings thereof, electron and hole transport properties may be more improved.

For example, $Ar_{11}$ to $Ar_{15}$ in the above Chemical Formulae 2 to 5 may be a monocyclic aryl, e.g., phenyl, biphenyl, terphenyl, styrene, and the like, or a polycyclic aryl, e.g., naphthyl, anthracenyl, phenanthrenyl, pyrenyl, peryenyl, and the like. Accordingly, the polymer may be particularly useful as a material of an emission layer of an organic photoelectric device.

The repeating unit represented by the above Chemical Formula 1 may be represented by the following Chemical Formulae 6 to 18.

[Chemical Formula 6]
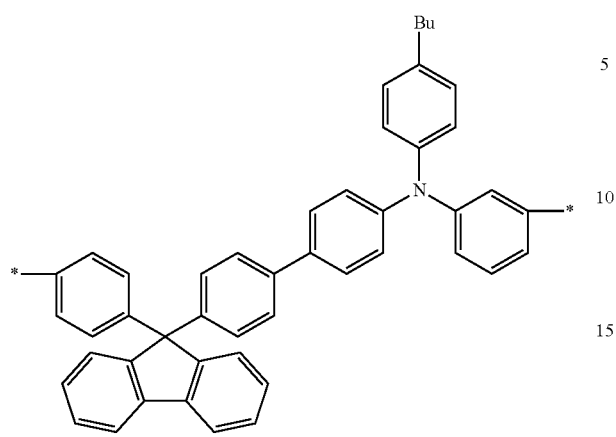
[Chemical Formula 7]
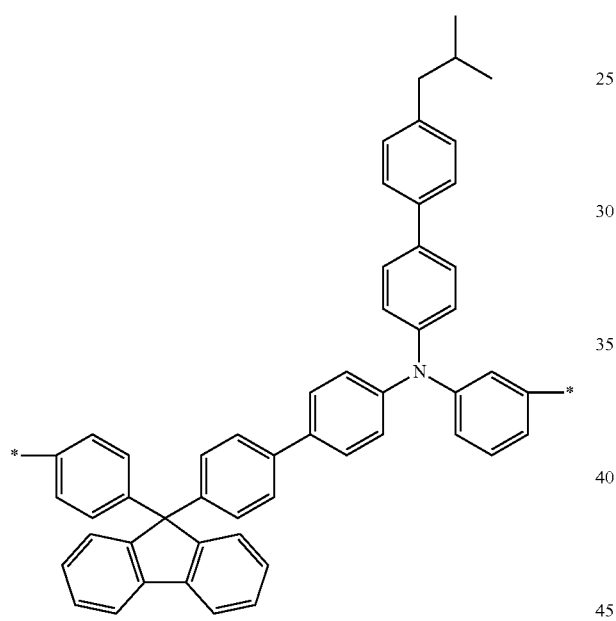
[Chemical Formula 8]
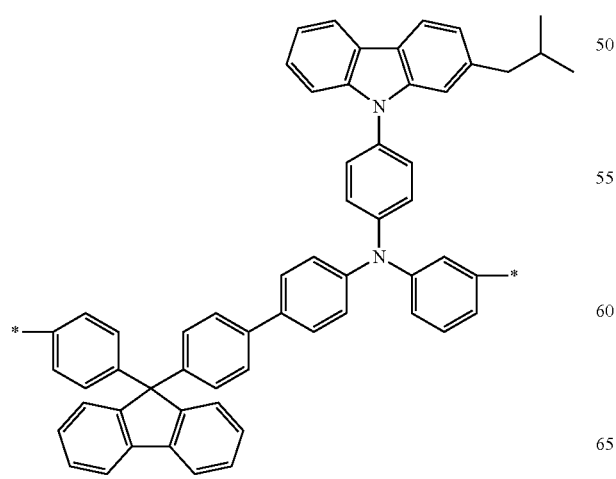
-continued
[Chemical Formula 9]
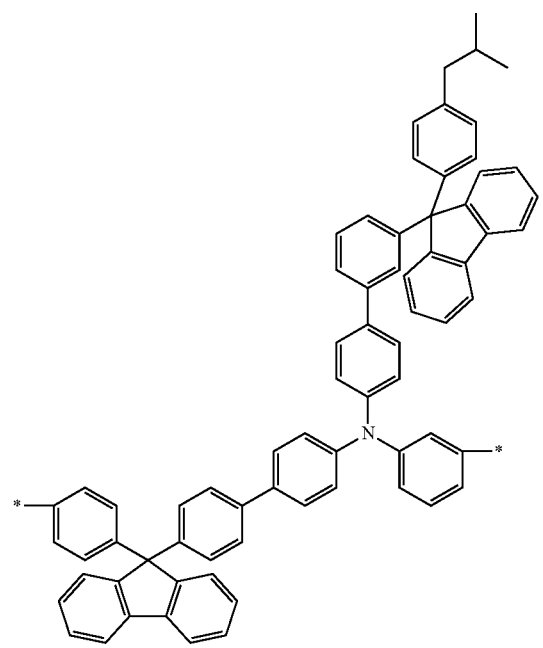
[Chemical Formula 10]
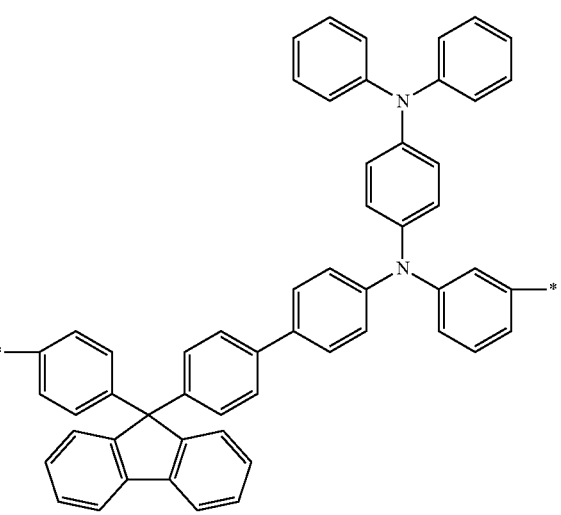

[Chemical Formula 11]
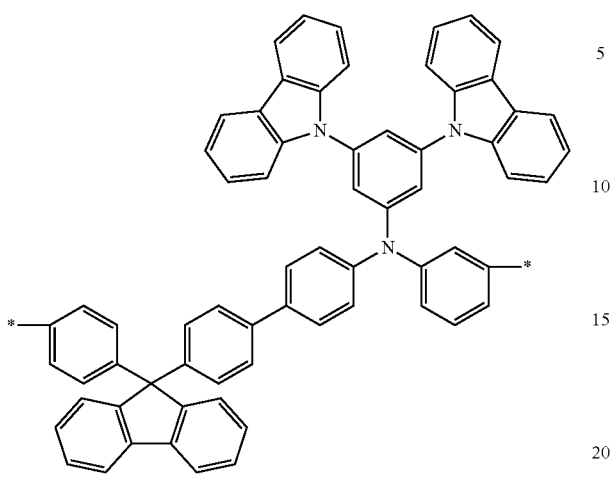
[Chemical Formula 12]
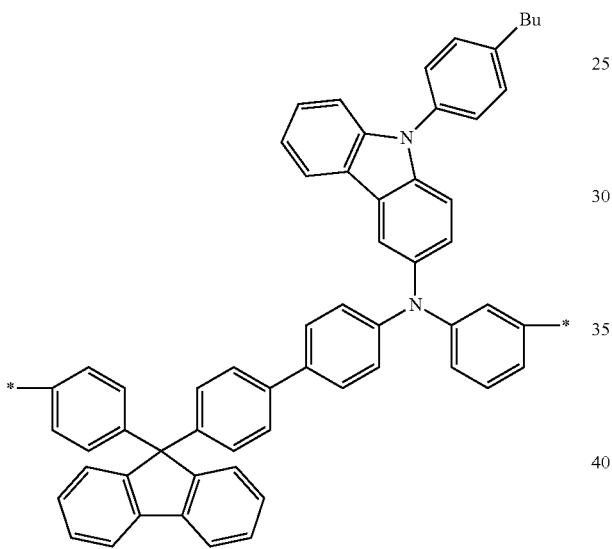
[Chemical Formula 13]
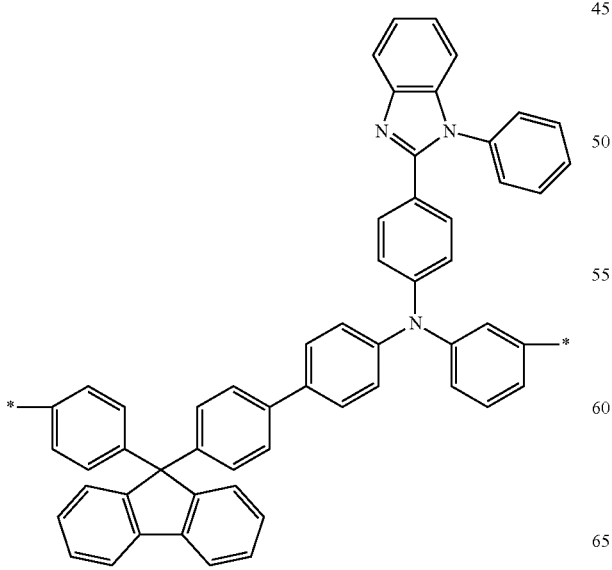
[Chemical Formula 14]
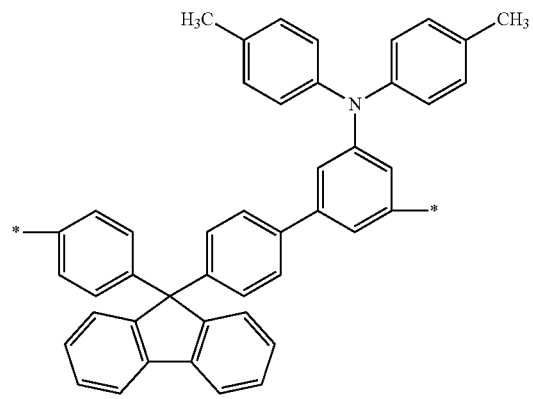
[Chemical Formula 15]
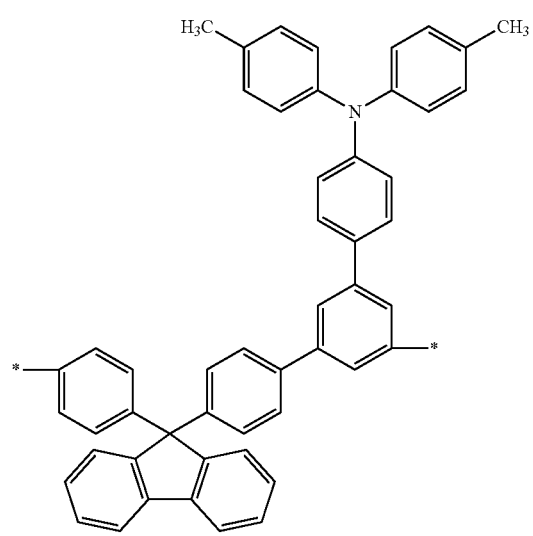
[Chemical Formula 16]
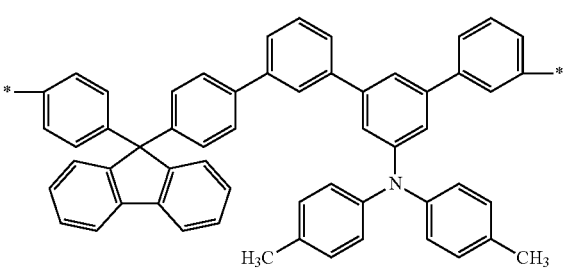

[Chemical Formula 17]

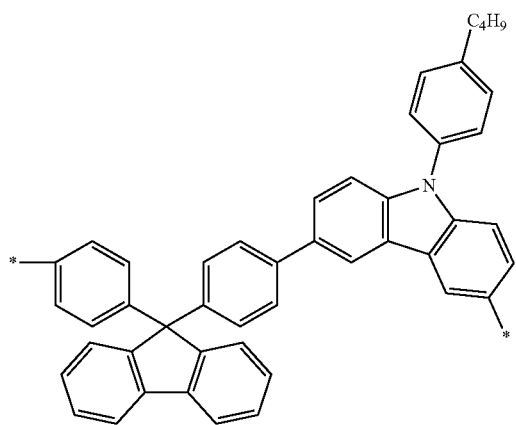

[Chemical Formula 18]

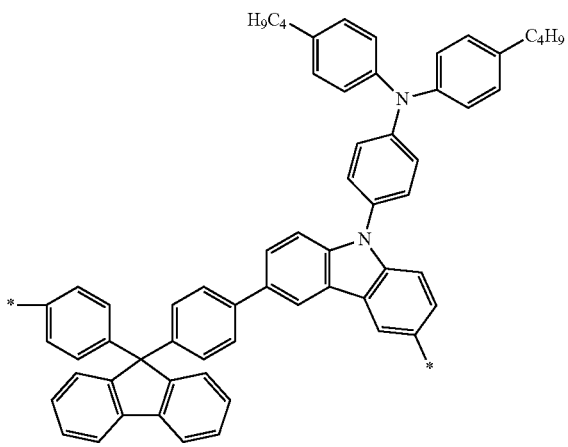

In an implementation, the substituent $Ar_1$ represented by the above Chemical Formula 2 may be a substituent represented by the following Chemical Formula 19.

[Chemical Formula 19]

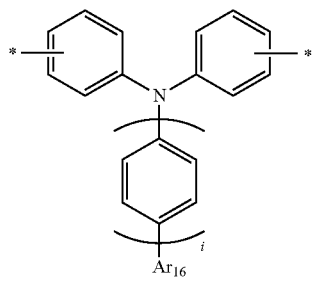

In the above Chemical Formula 19, $Ar_{16}$ may be one of hydrogen, a substituted or unsubstituted phenyl group, a substituted or unsubstituted biphenyl group, a substituted or unsubstituted terphenyl group, a substituted or unsubstituted fluorene group, a substituted or unsubstituted carbazole group, a substituted or unsubstituted benzimidazole group, and a substituted or unsubstituted arylamine group, and i may be 0 or 1. In an implementation, i may be 1.

In an implementation, the substituent $Ar_1$ represented by the above Chemical Formula 3 may be a substituent represented by the following Chemical Formula 20.

[Chemical Formula 20]

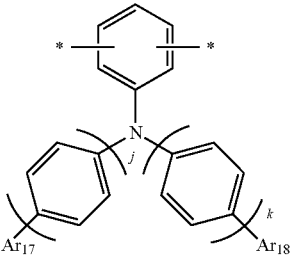

In the above Chemical Formula 20, $Ar_{15}$ and $Ar_{16}$ may each independently be one of hydrogen, a substituted or unsubstituted phenyl group, a substituted or unsubstituted biphenyl group, a substituted or unsubstituted terphenyl group, a substituted or unsubstituted fluorene group, a substituted or unsubstituted carbazole group, a substituted or unsubstituted benzimidazole group, and a substituted or unsubstituted arylamine group, and j and k may each independently be 0 or 1. In an implementation, j and k may be 1.

In an implementation, the polymer according to an embodiment may be a polymer having a weight average molecular weight of about 15,000 or more.

The polymer according to an embodiment may further include a cross-linkable functional group at a terminal end thereof to enforce interface stability of an organic thin layer (due to formation of cross-linking). In addition, another organic thin layer being eluted or eroded by a solvent during the wet process may be prevented by using the polymer having improved interface stability. Thus, it is possible to provide an organic photoelectric device having excellent life-span and efficiency characteristics.

The cross-linking bond may result from various cross-linking reactions, e.g., thermosetting, photosetting, and the like.

The cross-linkable functional group is not particularly limited, and may include, e.g., a substituted or unsubstituted alkenyl group, a substituted or unsubstituted (meth)acryl group, a substituted or unsubstituted epoxy group, a substituted or unsubstituted styrene group, and/or a substituted or unsubstituted alkoxy group. Here, term "substituted" refers to one substituted with a C1 to C10 alkyl group or a C6 to C30 aryl group.

The polymer according to an embodiment may have a difference of about 2.4 eV or more between a highest occupied molecular orbital (HOMO) and a lowest unoccupied molecular orbital (LUMO). The polymer according to an embodiment may include a repeating unit that provides for excellent hole injection and transport properties. Accordingly, the polymer may be useful for hole injection and for a transport layer of a organic light emitting diode. For example, the polymer may have a sufficiently large energy band gap. Thus, it may improve life-span and efficiency characteristics when applied to an organic photoelectric device.

Another embodiment provides an organic photoelectric device including an anode, a cathode, and an organic thin layer between the anode and cathode. The organic thin layer may include the polymer according to an embodiment. The organic photoelectric device may be, e.g., an organic light emitting diode, an organic solar cell, an organic transistor, an organic photo-conductor drum, an organic memory device, and the like. For example, the organic solar cell may include the polymer according to an embodiment in an electrode or in an electrode buffer layer to improve quantum efficiency; and an organic transistor may include the same as an electrode material in a gate, source-drain electrode, or the like.

The organic photoelectric device according to the present embodiment may be a phosphorescent organic light emitting diode. The phosphorescent organic light emitting diode is a device including an emission layer including a phosphorescent light emitting material. The phosphorescent light emitting material may include a material including a metal complex capable of emitting light by multiplet excitation more than triplet. For example, the phosphorescent light emitting material may include an organic metal compound including Ir, Pt, Os, Ti, Zr, Hf, Eu, Tb, Tm, or a combination thereof, or an oligomer or polymer material including the same. For example, the red phosphorescent dopant may include a platinum-octaethyl porphyrin (PtOEP) complex, $Ir(Piq)_2(acac)$, $Ir(Piq)_3$, or the like; the green phosphorescent dopant may include $Ir(PPy)_2(acac)$, $Ir(PPy)_3$, or the like; and the blue phosphorescent dopant may include $(4,6-F_2PPy)_2Irpic$ or the like. Herein, Piq refers to 1-phenylisoquinoline, acac refers to acetylacetonate, $F_2PPy$ refers to 2-(difluorophenyl)pyridinato, pic refers to picolinate, and PPy refers to 2-phenylpyridine.

The polymer according to an embodiment may be used as a host material or a charge transporting material.

In addition, the organic thin layer including the polymer may include at least one of an emission layer, a hole transport layer (HTL), a hole injection layer (HIL), a hole blocking layer, and electron transport layer (ETL), an electron injection layer (EIL), and an electron blocking layer. At least one layer thereof may include the polymer according to an embodiment.

Hereinafter, an organic photoelectric device according to an embodiment is described in detail.

FIGS. 1 to 5 illustrate cross-sectional views showing an organic light emitting diode including the polymer according to an embodiment.

Referring to FIGS. 1 to 5, organic light emitting diodes 100, 200, 300, 400, and 500 according to an embodiment may include at least one organic thin layer 105 interposed between an anode 120 and a cathode 110.

The anode 120 may include an anode material laving a large work function to facilitate hole injection into an organic thin layer. The anode material may include a metal such as nickel, platinum, vanadium, chromium, copper, zinc, and gold, or alloys thereof; a metal oxide such as zinc oxide, indium oxide, indium tin oxide (ITO), and indium zinc oxide (IZO); a combined metal and oxide such as $ZnO:Al$ or $SnO_2:Sb$; or a conductive polymer such as poly(3-methylthiophene), poly[3,4-(ethylene-1,2-dioxy)thiophene] (PEDT), polypyrrole, and polyaniline, but is not limited thereto. It is preferable to include a transparent electrode including indium tin oxide (ITO) as an anode.

The cathode 110 may include a cathode material having a small work function to facilitate electron injection into an organic thin layer. The cathode material may include a metal such as magnesium, calcium, sodium, potassium, titanium, indium, yttrium, lithium, gadolinium, aluminum, silver, tin, and lead, or alloys thereof; or a multi-layered material such as $LiF/Al$, $Liq/Al$, $LiO_2/Al$, $LiF/Ca$, $LiF/Al$, and $BaF_2/Ca$, but is not limited thereto. It is preferable to include a metal electrode including aluminum as a cathode.

Referring to FIG. 1, an organic photoelectric device 100 may include an organic thin layer 105 including only an emission layer 130.

Figure 2:
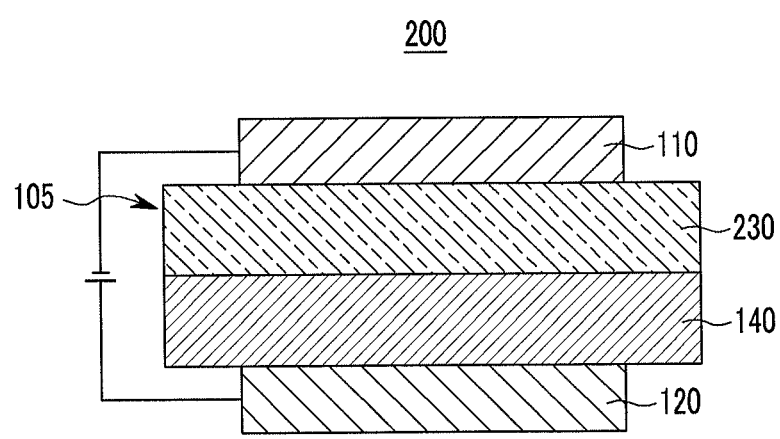

Referring to FIG. 2, a double-layered organic photoelectric device 200 may include an organic thin layer 105 including an emission layer 230 (including an electron transport layer (ETL)) and a hole transport layer (HTL) 140. The emission layer 230 may also function as an electron transport layer (ETL); and the hole transport layer (HTL) 140 layer may have an excellent binding property with a transparent electrode such as ITO and/or excellent hole transporting properties.

Figure 3:
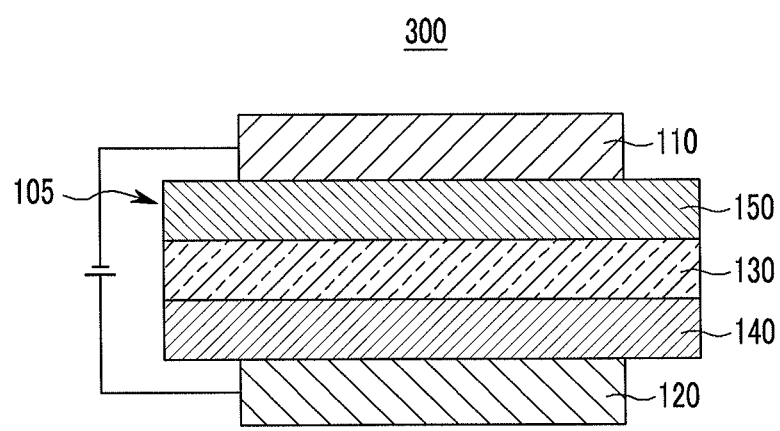

Referring to FIG. 3, a three-layered organic photoelectric device 300 may include an organic thin layer 105 including an electron transport layer (ETL) 150, an emission layer 130, and a hole transport layer (HTL) 140. The emission layer 130 may be independently installed, and layers having an excellent electron transporting property, e.g., the electron transport layer (ETL) 150, and/or an excellent hole transporting property, e.g., the hole transport layer (HTL) 140, may be separately stacked.

Figure 4:
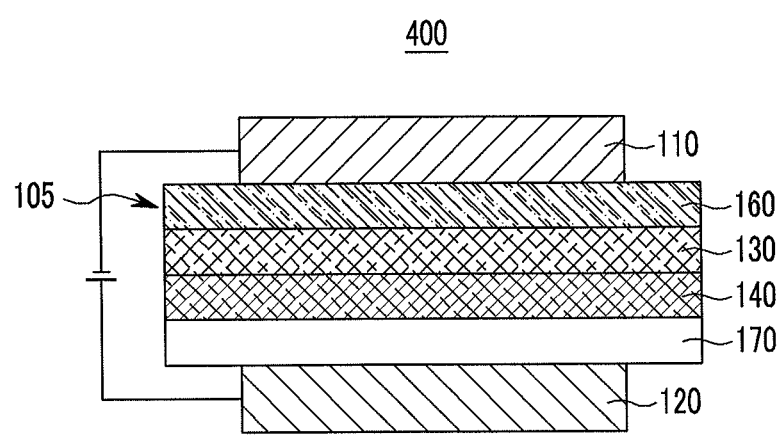

As shown in FIG. 4, a four-layered organic photoelectric device 400 may include an organic thin layer 105 including an electron injection layer (EIL) 160, an emission layer 130, a hole transport layer (HTL) 140, and a hole injection layer (HIL) 170 for binding with the anode 120 of ITO.

Figure 5:
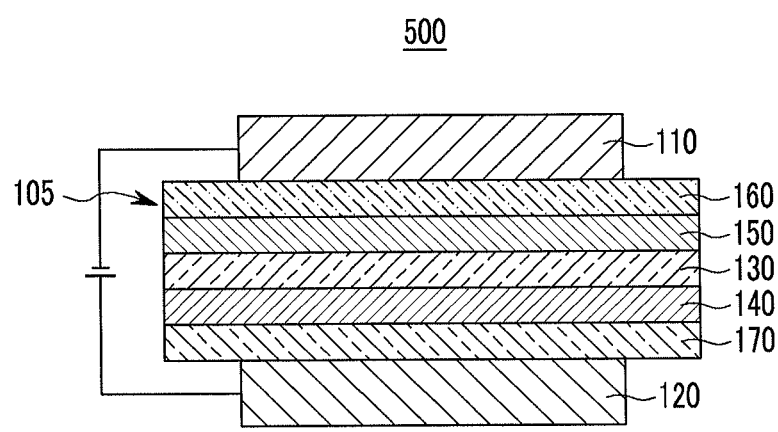

As shown in FIG. 5, a five layered organic photoelectric device 500 may include an organic thin layer 105 including an electron transport layer (ETL) 150, an emission layer 130, a hole transport layer (HTL) 140, and a hole injection layer (HIL) 170, and may further include an electron injection layer (EIL) 160 to achieve a low voltage.

In FIGS. 1 to 5, the organic thin layer 105 including at least one of an electron transport layer (ETL) 150, an electron injection layer (EIL) 160, an emission layer 130 or 230, a hole transport layer (HTL) 140, and a hole injection layer (HIL) 170 may include the polymer of an embodiment. The polymer for the organic photoelectric device may be used for an electron transport layer (ETL) 150 or an electron injection layer (EIL) 160. When the polymer is used for the electron transport layer (ETL), it is possible to provide an organic photoelectric device having a simpler structure because an additional hole blocking layer (not shown) may not be required.

The organic photoelectric device may be fabricated by forming an anode on a substrate; forming an organic thin layer in accordance with a dry coating method, e.g., evaporation, sputtering, plasma plating, and anion plating, or a wet coating method, e.g., spin coating, dipping, and flow coating; and providing a cathode thereon.

For example, the polymer according to an embodiment may form an organic thin layer in accordance with a wet coating process, so as to be more usefully applied to a large-sized display device. In addition, the polymer according to an embodiment may enforce the layer interface stability by providing the organic thin layer with a cross-linking bond. The polymer having improved interface stability may prevent another organic thin layer from being eluted or eroded by a solvent during the wet process, so it is possible to provide an organic photoelectric device having improved life-span and efficiency characteristics.

Another embodiment provides a display device including the organic photoelectric device according to the above-described embodiment.

The following Examples and Comparative Examples are provided in order to set forth particular details of one or more embodiments. However, it will be understood that the embodiments are not limited to the particular details described. Further, the Comparative Examples are set forth to highlight certain characteristics of certain embodiments, and are not to be construed as either limiting the scope of the invention as exemplified in the Examples or as necessarily being outside the scope of the invention in every respect.

EXAMPLE 1

Synthesis of Polymer (1)

A polymer (1) was synthesized through the following two steps.

Step 1: Synthesizing Monomer (1)

[Reaction Scheme 1]

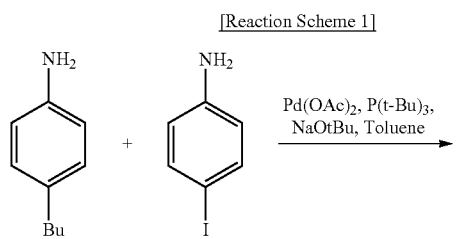

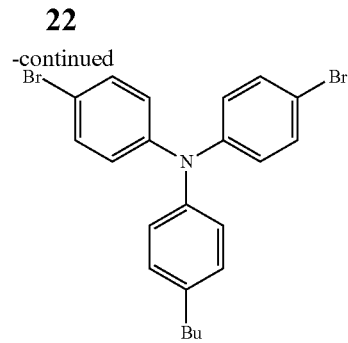

2 g (13.4 mmol) of 4-butylaniline, 15.16 g (53.6 mmol) of 4-bromo-1-iodobenzene, 0.3 g (1.34 mmol) of palladium acetate, 0.542 g (2.68 mmol) of P(t-Bu)$_3$, and 3.86 g (40.2 mmol) of sodium-t-butoxide were mixed in 150 ml of anhydrous toluene and heated and refluxed for 24 hours. After completing the reaction, the resultant was cooled to room temperature and extracted with ethyl acetate and water several times. Then moisture was removed with anhydrous magnesium sulfate and filtered, and the solvent was removed under reduced pressure.

The resultant was purified by gel permeation chromatography (silica gel column, GPC) to provide 2.2 g (yield: 36%) of a monomer (1). The synthesized monomer (1) was confirmed by $^1$H-NMR using Bruker 300 MHz.

$^1$H-NMR (CDCl$_3$, ppm): δ 0.93 (triplet, 3H), 1.34 (multiplet, 2H), 1.59 (multiplet, 2H), 2.56 (triplet, 2H), 6.92 (multiplet, 6H), 7.05 (singlet, 1H), 7.09 (singlet, 1H), 7.28-7.32 (doublet of triplet, 4H).

Step 2: Synthesizing Polymer (1)

[Reaction Scheme 2]

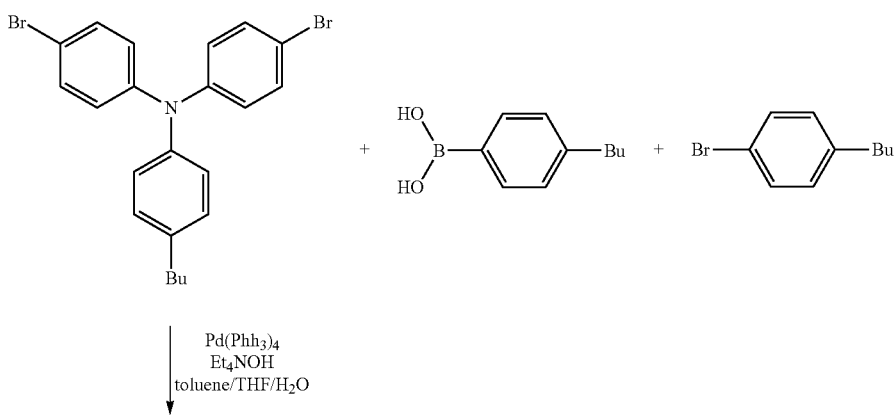

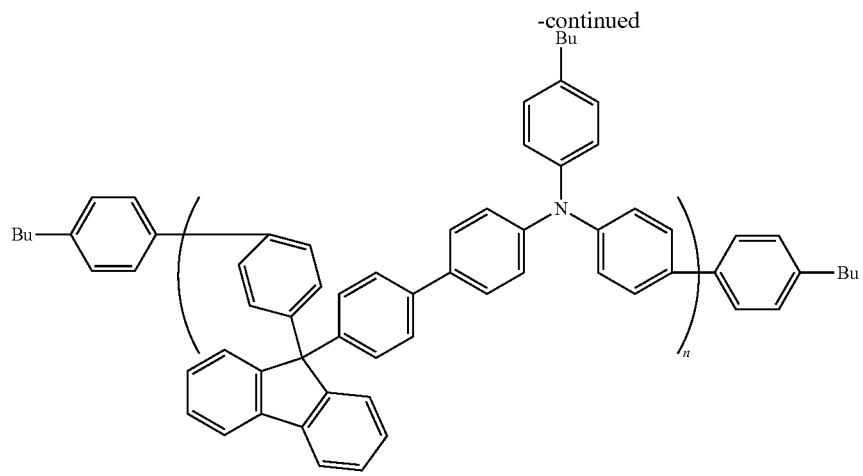

0.775 g (1 mmol) of monomer (1) obtained from step 1, 0.584 g (1 mmol) of fluoreneboronic acid-pinacolate, 6 mg (0.005 mmol) of tetrakis(triphenylphosphine)palladium, 10 ml of tetraethylammonium hydroxide aqueous solution, 10 ml of toluene, and 10 ml of tetrahydrofuran (THF) were mixed under a nitrogen atmosphere and heated and agitated at 80° C. for 18 hours.

0.1 ml of 1-bromo-4-butylbenzene was added into the mixed solution and agitated for 2 hours, and then 0.1 g of 4-butylphenylboronic acid was added and agitated for 4 hours. The resultant was precipitated in 200 ml of methanol to deposit a polymer. The obtained polymer was dissolved in 10 ml of toluene and introduced into 200 ml of a mixed solution of acetone:ethanol:water (volume ratio 4:2:1) and reprecipitated. The precipitated polymer was filtered and dissolved in toluene and purified by gel permeation chromatography (Florisil column, GPC). Thus, 1 g of yellow polymer (1) was obtained. It may be seen from the GPC analysis results that the polymer (1) had a number average molecular weight (Mn) of 5,800, a weight average molecular weight (Mw) of 11,800, and molecular weight distribution (polydispersity, PDI=Mw/Mn) of 2.0.

EXAMPLE 2

Synthesis of Polymer (2)

A polymer (2) was synthesized through the following two steps.

Step 1: Synthesizing Monomer (2)

Reaction Scheme 3

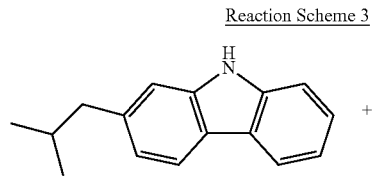
+
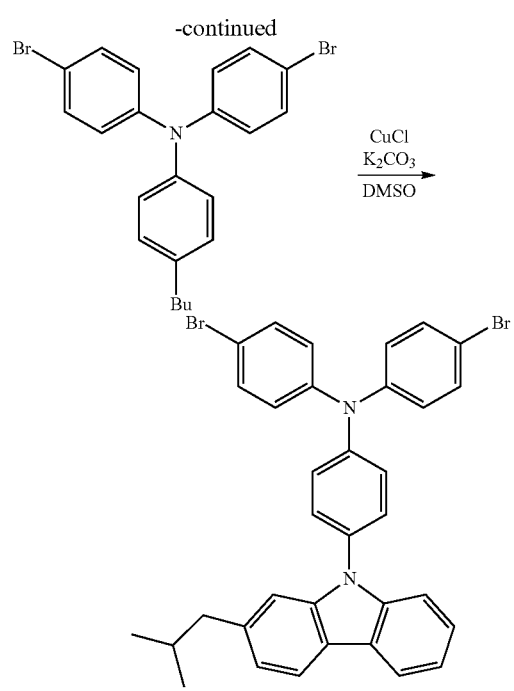

2.223 g (10 mmol) of isobutylcarbazole, 4.82 g (20 mmol) of tris(4-bromophenyl)amine, 0.3 g (3 mmol) of cuprous chloride and 4.1463 g (30 mmol) of potassium carbonate were suspended in 40 ml of dimethyl sulfoxide (DMSO) and heated and refluxed for 4 hours. After completing the reaction, the resultant was cooled to room temperature and extracted with ethyl acetate and water several times. Then moisture was removed with anhydrous magnesium sulfate and filtered, and the solvent was removed under reduced pressure.

The resultant was purified by gel permeation chromatography (silica gel column, GPC) to provide 2.4 g (yield: 32%) of monomer (2). The synthesized monomer (2) was confirmed by $^1$H-NMR using Bruker 300 MHz.

$^1$H-NMR (CDCl$_3$, ppm): δ 0.92 (doublet, 6H), 1.93 (multiplet, 1H), 2.61 (doublet, 2H), 7.08 (multiplet, 5H), 7.25 (multiplet, 4H), 7.40 (multiplet, 8H), 8.02 (doublet, 1H), 8.10 (doublet, 1H).

Step 2: Synthesizing Polymer (2)
Reaction Scheme 4
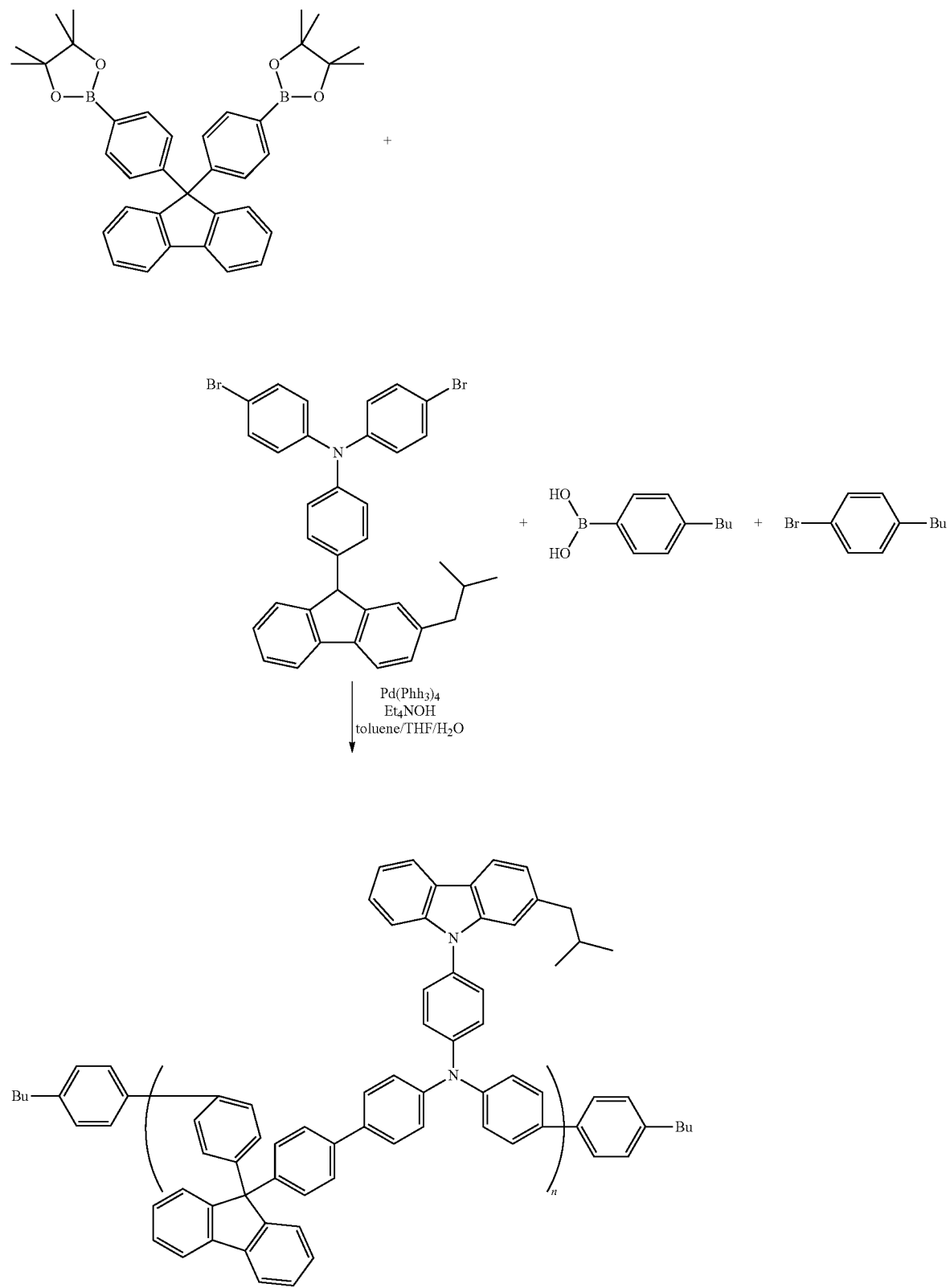

0.624 g (1 mmol) (MW 624.42) of the monomer 2 obtained from step 1, 0.584 g (1 mmol) of fluoreneboronic acid-pinacolate, 6 mg (0.005 mmol) of tetrakis(triphenylphosphine) palladium, 10 ml of tetraethylammonium hydroxide aqueous solution, 10 ml of toluene, and 10 ml of THF were mixed under a nitrogen atmosphere and heated and agitated at 80° C. for 18 hours.

0.1 ml of 1-bromo-4-butylbenzene was added into the mixed solution and agitated for 2 hours, and then 0.1 g of 4-butylphenylboronic acid was added and agitated for 4 hours. The resultant was precipitated in 100 ml of methanol to deposit a polymer. The obtained polymer was dissolved in 50 ml of toluene and introduced and reprecipitated in 300 ml of a mixed solution of acetone:ethanol:water (1:1:1 volume ratio). The precipitated polymer was filtered and dissolved in toluene and purified by gel permeation chromatography (Florisil column, GPC). Thus, 1 g of a yellow polymer (2) was obtained. It may be seen from GPC analysis results that the polymer (2) had a number average molecular weight (Mn) of 10,000, a weight average molecular weight (Mw) of 19,500, a molecular weight distribution (polydispersity, PDI=Mw/Mn) of 2.0.

EXAMPLE 3

Synthesis of Polymer (3)

A polymer (3) was synthesized through the following two steps.

Step 1: Synthesizing Monomer (3)

Reaction Scheme 5

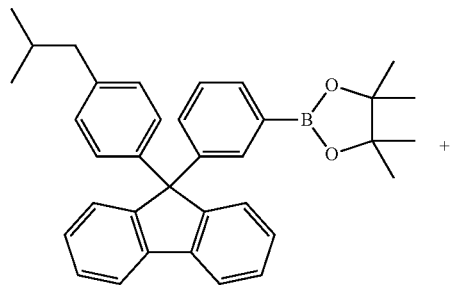

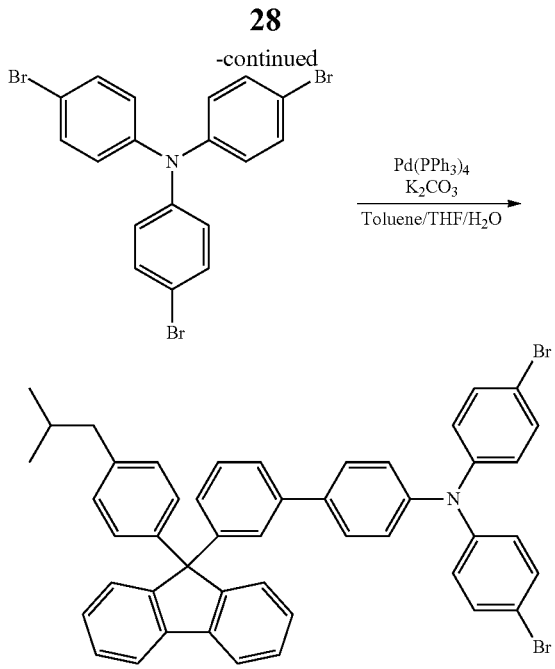

1 g (2 mmol) of isobutylfluorene boronic acid-pinacolate, 1.93 g (4 mmol) of tris(4-bromophenyl)amine, 0.058 g (0.05 mmol) of tetrakis(triphenylphosphine)palladium, and 0.55 g (4 mmol) of potassium carbonate were mixed in 60 ml of toluene, 60 ml of THF, and 30 ml of distilled water, and heated and agitated for 2 hours. After completing the reaction, the resultant was cooled to room temperature and extracted with ethyl acetate and water several times. Then moisture was removed with anhydrous magnesium sulfate and filtered, and the solvent was removed under reduced pressure.

The resultant was purified by gel permeation chromatography (silica gel column, GPC) to provide 3.1 g (yield: 32%) of a monomer (3). The synthesized monomer (3) was confirmed by $^1$H-NMR using Bruker 300 MHz.

$^1$H-NMR (CDCl$_3$, ppm): δ 0.85 (doublet, 6H), 1.79 (multiplet, 1H), 2.38 (doublet, 2H), 6.87 (multiplet, 8H), 7.10-7.45 (multiplet, 18H), 7.72 (doublet, 2H).

Step 2: Synthesizing Polymer (3)

Reaction Scheme 6

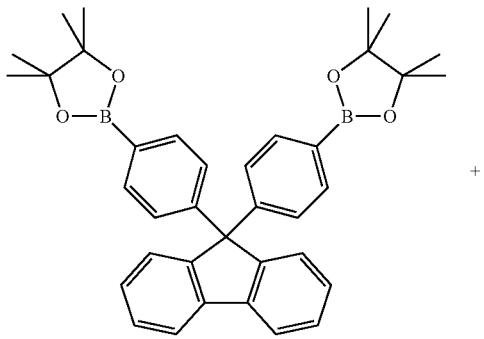

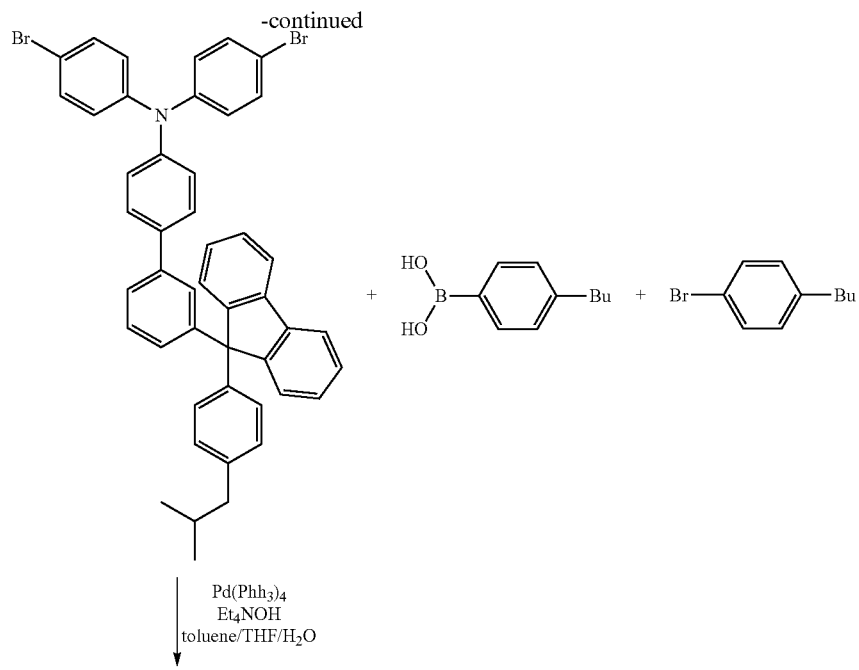

-continued

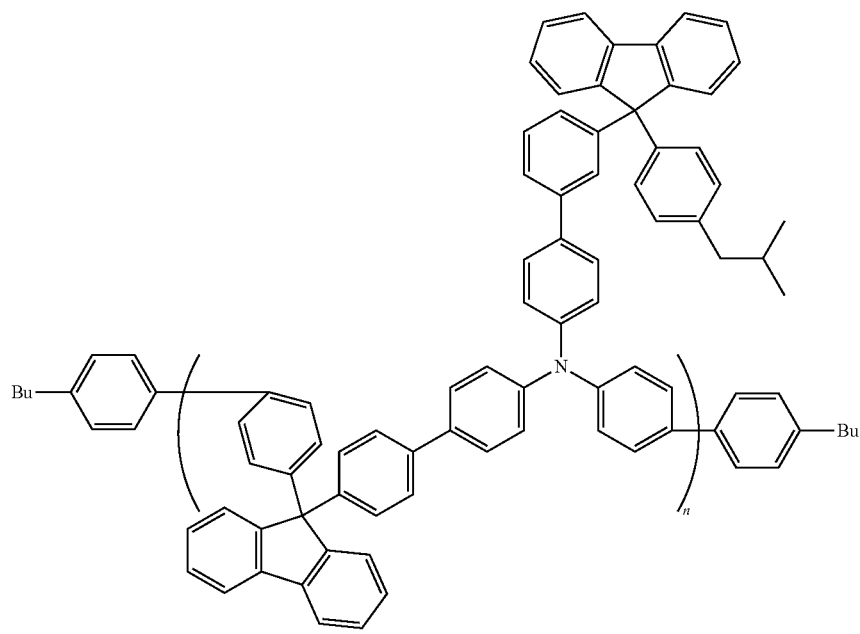

0.775 g (1 mmol) (MW 775.61) of the monomer (3) obtained from step 1, 0.584 g (1 mmol) of fluoreneboronic acid-pinacolate, 6 mg (0.005 mmol) of tetrakis(triphenylphosphine)palladium, 10 ml of tetraethylammonium hydroxide aqueous solution, 10 ml of toluene, and 10 ml of THF were mixed under a nitrogen atmosphere and heated and agitated at 80° C. for 18 hours.

0.1 ml of 1-bromo-4-butylbenzene was added into the mixed solution and agitated for 2 hours, and then 0.1 g of 4-butylphenylboronic acid was added and agitated for 4 hours. The resultant was precipitated in 200 ml of methanol to deposit a polymer. The obtained polymer was dissolved in 10 ml of toluene and introduced and reprecipitated in 200 ml of a mixed solution of acetone:ethanol:water (4:2:1 volume ratio). The precipitated polymer was filtered and dissolved in toluene and purified by gel permeation chromatography (Florisil column, GPC). Thus, 1 g of a yellow polymer (3) was obtained. It was confirmed from GPC analysis results that the polymer (3) had a number average molecular weight (Mn) of 14,200, a weight average molecular weight (Mw) of 24,000, and a molecular weight distribution (polydispersity, PDI=Mw/Mn) of 1.7.

EXAMPLE 4

Synthesis of Polymer (4)

A polymer (4) was synthesized through the following two steps.

Step 1: Synthesizing Monomer (2)

Reaction Scheme 7

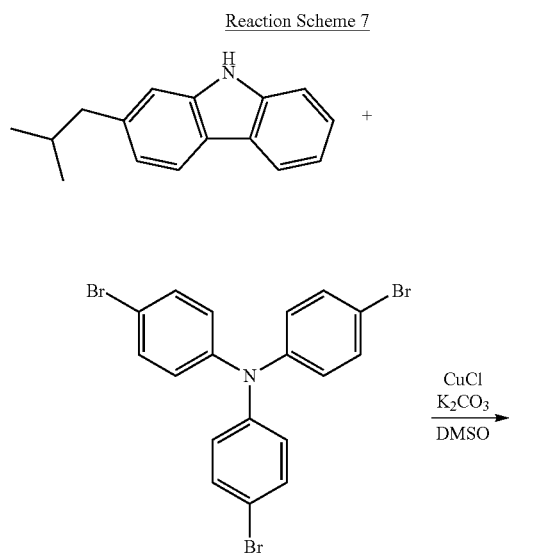

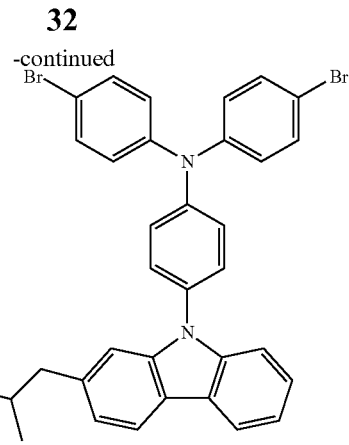

2.223 g (10 mmol) of isobutylcarbazole, 4.82 g (20 mmol) of tris(4-bromophenyl)amine, 0.3 g (3 mmol) of cuprous chloride, and 4.15 g (30 mmol) of potassium carbonate were suspended in 40 ml of dimethylsulfoxide (DMSO) and heated and refluxed for 4 hours. After completing the reaction, the resultant was cooled to room temperature and extracted with ethylacetate and water several times. Then the moisture was removed with anhydrous magnesium sulfate and filtered, and then the solvent was removed under reduced pressure.

The resultant was purified by gel permeation chromatography (silica gel column, GPC) to provide 2.4 g (yield: 32%) of a monomer (2). The synthesized monomer (2) was confirmed by $^1$H-NMR using Bruker 300 MHz.

$^1$H-NMR (CDCl$_3$, ppm): δ 0.92 (doublet, 6H), 1.93 (multiplet, 1H), 2.61 (doublet, 2H), 7.08 (multiplet, 5H), 7.25 (multiplet, 4H), 7.40 (multiplet, 8H), 8.02 (doublet, 1H), 8.10 (doublet, 1H).

Step 2: Synthesizing Polymer (4)

Reaction Scheme 8

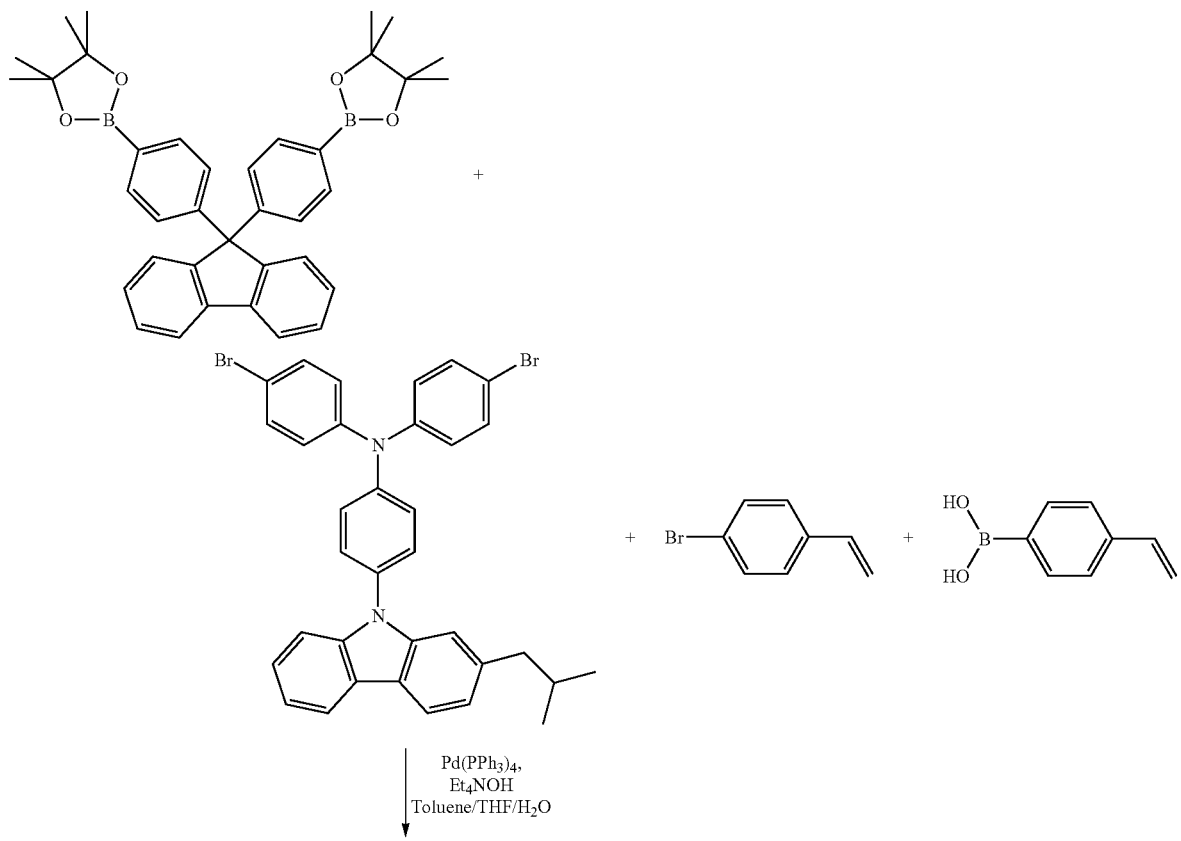

-continued

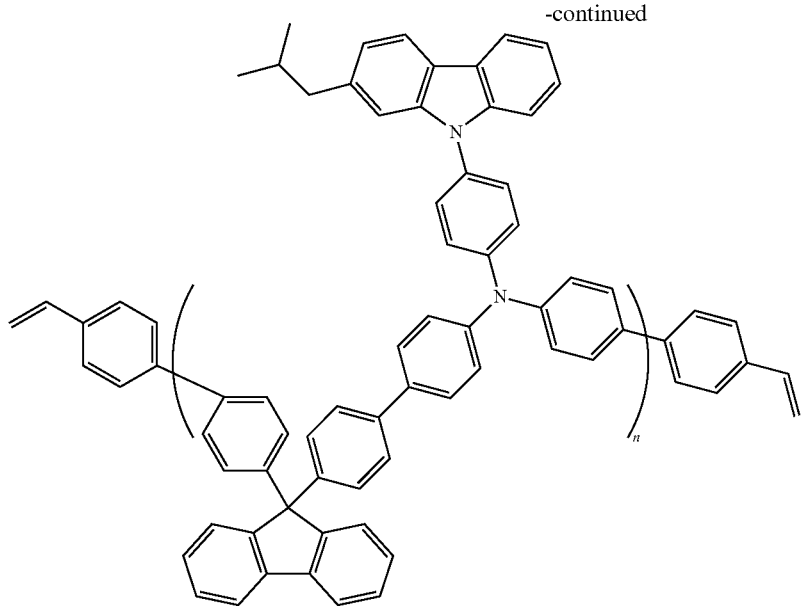

0.624 g (1 mmol) of the monomer (2) obtained from step 1, 0.584 g (1 mmol) of fluoreneboronic acid-pinacolate, 6 mg (0.005 mmol) of tetrakis(triphenylphosphine)palladium, 10 ml of tetraethylammonium hydroxide aqueous solution, 10 ml of toluene, and 10 ml of THF were mixed under a nitrogen atmosphere and agitated at 100° C. for 8 hours.

After cooling to 80° C., 0.183 g of 4-bromostyrene was added and agitated for 2 hours, and then 0.2 g of 4-styreneboronic acid was added and agitated for 4 hours. The resultant was precipitated in 200 ml of methanol to deposit a polymer. The obtained polymer was dissolved in 50 ml of toluene and introduced and reprecipitated in 300 ml of a mixed solution of acetone:ethanol:water (1:1:1 volume ratio). The precipitated polymer was filtered and dissolved in toluene and purified by Florisil column chromatography. Thus, 1 g of a yellow polymer (4) was obtained. The polymer (4) had a number average molecular weight (Mn) of 18,000.

Figure 6:
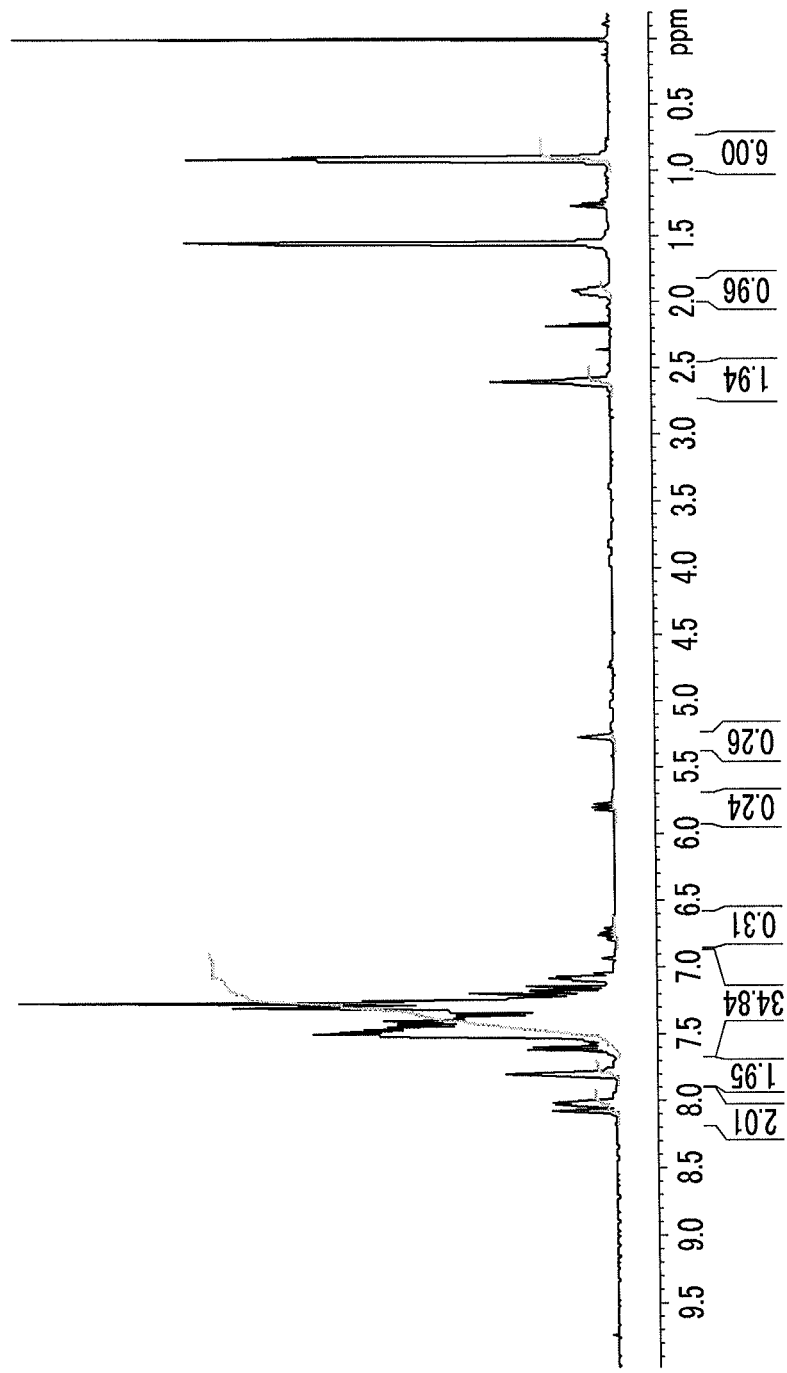
FIG. 6 illustrates a $^1$H-NMR spectrum of a polymer (4) according to Example 4.

A styrene group (cross-linking group) was confirmed by $^1$H-NMR (CDCl$_3$, ppm) and is shown in FIG. 6. As shown in FIG. 6, the proton peak was monitored at the traditional position of an ethylene group in a styrene group (5.3 ppm: 5.7 ppm: 6.7 ppm=1:1:1).

EXAMPLE 5

Synthesis of Polymer (5)

A polymer (5) was synthesized using two monomers used for polymer (4) in Example 4 and by changing terminal group reaction in order to increase a number of styrene groups.

Reaction Scheme 9

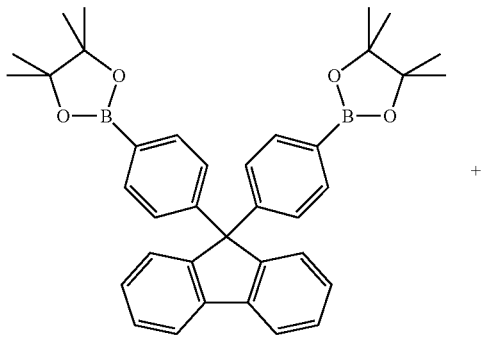

+

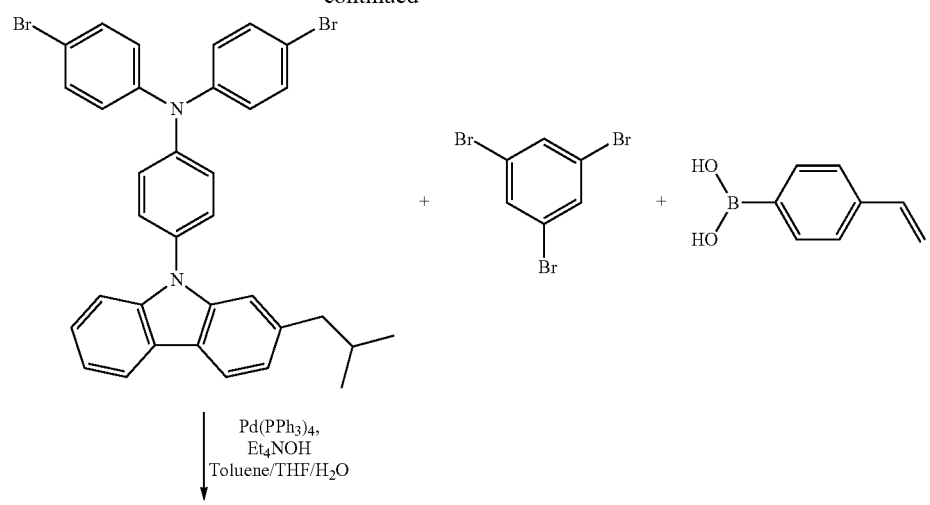
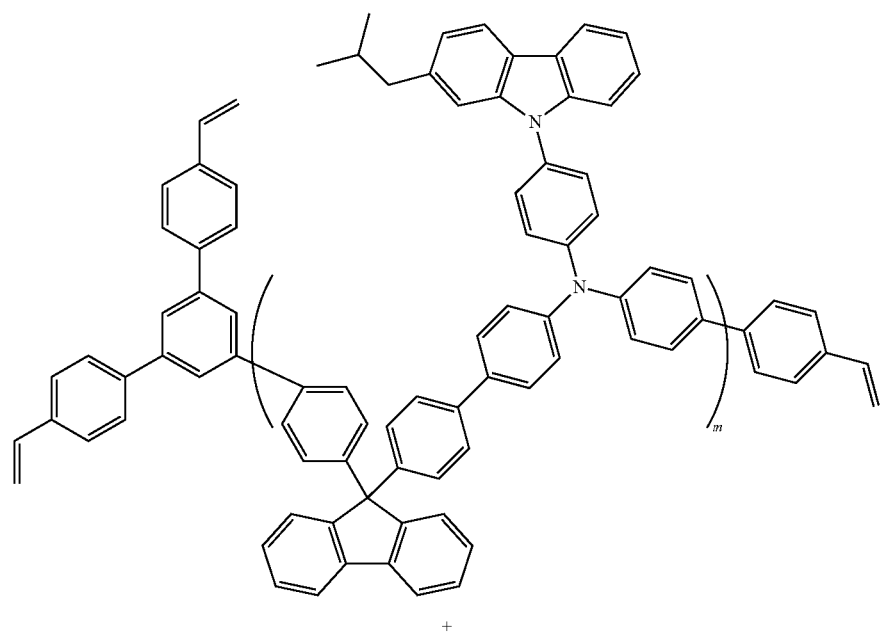

-continued

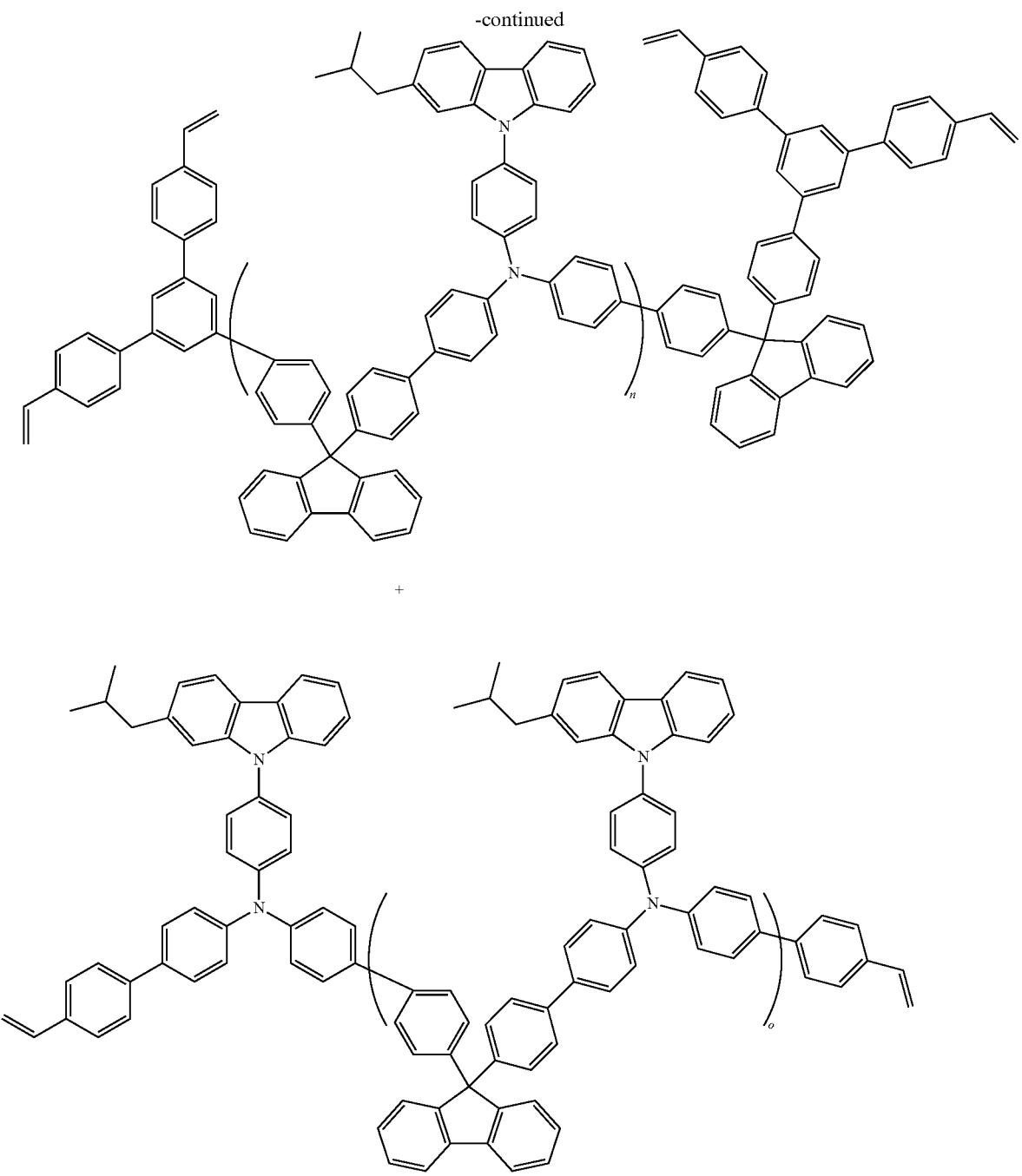

0.624 g (1 mmol) of the monomer (2) obtained from step 1 of Example 4, 0.584 g (1 mmol) of fluoreneboronic acid-pinacolate, 6 mg (0.005 mmol) of tetrakis(triphenylphosphine)palladium, 10 ml of tetraethylammonium hydroxide aqueous solution, 10 ml of toluene, and 10 ml of THF were mixed under a nitrogen atmosphere and agitated at 100° C. for 8 hours.

After cooling to 80° C., 0.315 g of 1,3,5-tribromobenzene was added and agitated for 2 hours, and then 0.6 g of 4-styreneboronic acid was added and agitated for 4 hours. The resultant was precipitated in 200 ml of methanol to deposit a polymer. The obtained polymer was dissolved in 50 ml of toluene and introduced and reprecipitated in 300 ml of a mixed solution of acetone:ethanol:water (1:1:1 volume ratio). The precipitated polymer was filtered and dissolved in toluene and purified by Florisil column gel permeation chromatography. Thus, 0.8 g of a yellow polymer (5) was obtained. The polymer (5) had a number average molecular weight (Mn) of 20,000.

EXAMPLE 6

Synthesis of Polymer 6

Polymer (6) was synthesized in accordance with the same procedure as in the process of polymer (4) of Example 4, except that 3,5-dibromo-N,N-di-p-tolylbenzenamine was used instead of the monomer (2) of Example 4.

Reaction Scheme 10

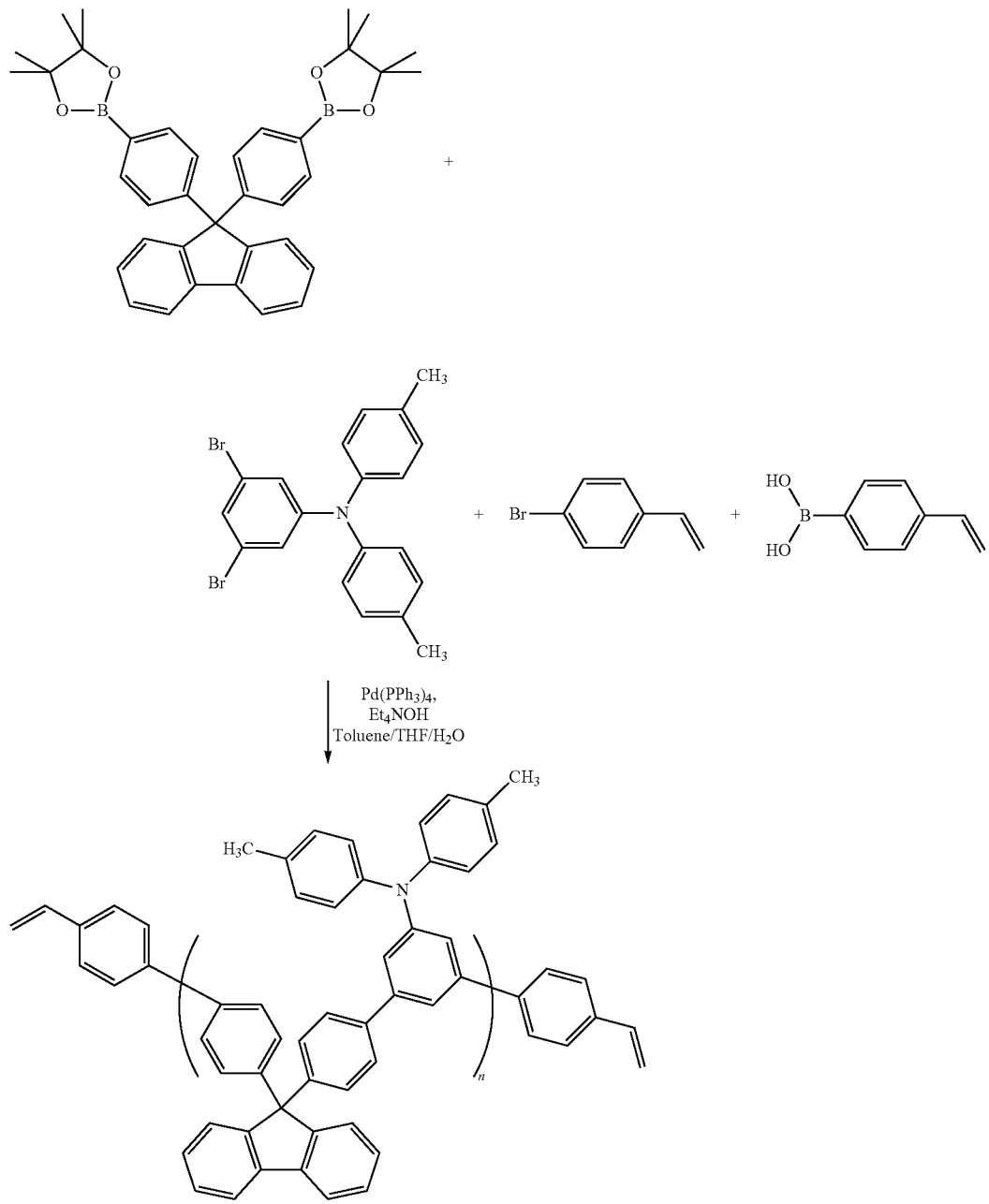

0.431 g (1 mmol) of 3,5-dibromo-N,N-di p-tolylbenzenamine, 0.584 g (1 mmol) of fluoreneboronic acid-pinacolate, 6 mg (0.005 mmol) of tetrakis(triphenylphosphine)palladium, 10 ml of tetraethylammonium hydroxide aqueous solution, 10 ml of toluene, and 10 ml of THF were mixed under a nitrogen atmosphere and agitated at 100° C. for 8 hours.

After cooling to 80° C., 0.183 g of 4-bromostyrene was added and agitated for 2 hours, and then 0.2 g of 4-styreneboronic acid was added and agitated for 4 hours. The resultant was precipitated in 200 ml of methanol to deposit a polymer. The obtained polymer was dissolved in 50 ml of toluene and introduced and reprecipitated in 300 ml of a mixed solution of acetone:ethanol:water (1:1:1 volume ratio). The precipitated polymer was filtered and dissolved in toluene and purified by Florisil column gel permeation chromatography. Thus, 1 g of a yellow polymer (6) was obtained. The polymer (6) had a number average molecular weight (Mn) of 17,000.

EXAMPLE 7

Synthesis of Polymer (7)

Polymer (7) was synthesized in accordance with the same procedure as in the synthesis process of polymer (5) of Example 5, except that 3,5-dibromo-N,N-di p-tolylbenzenamine was used instead of the monomer (2) of Example 4.

Reaction Scheme 11
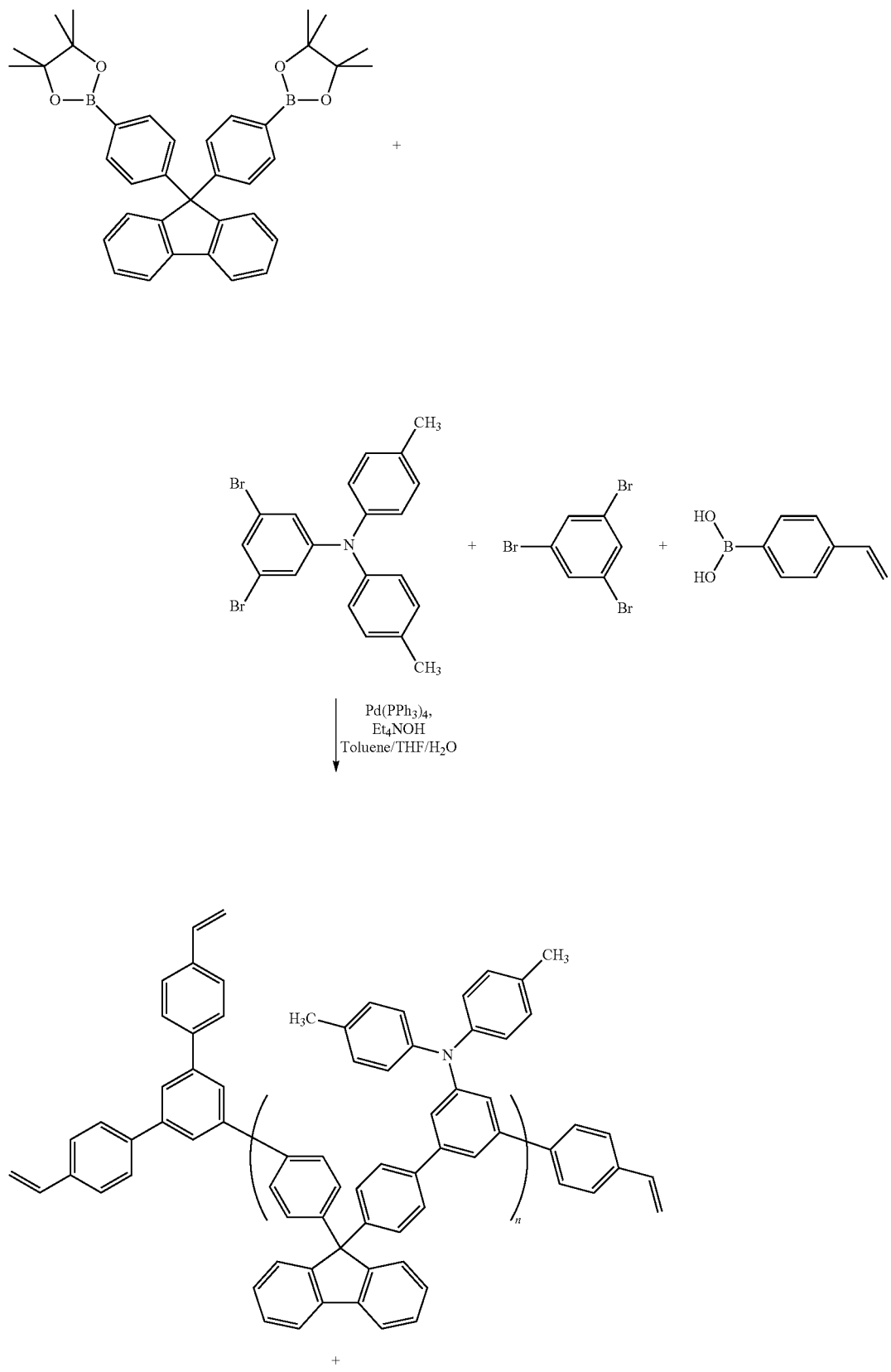

-continued

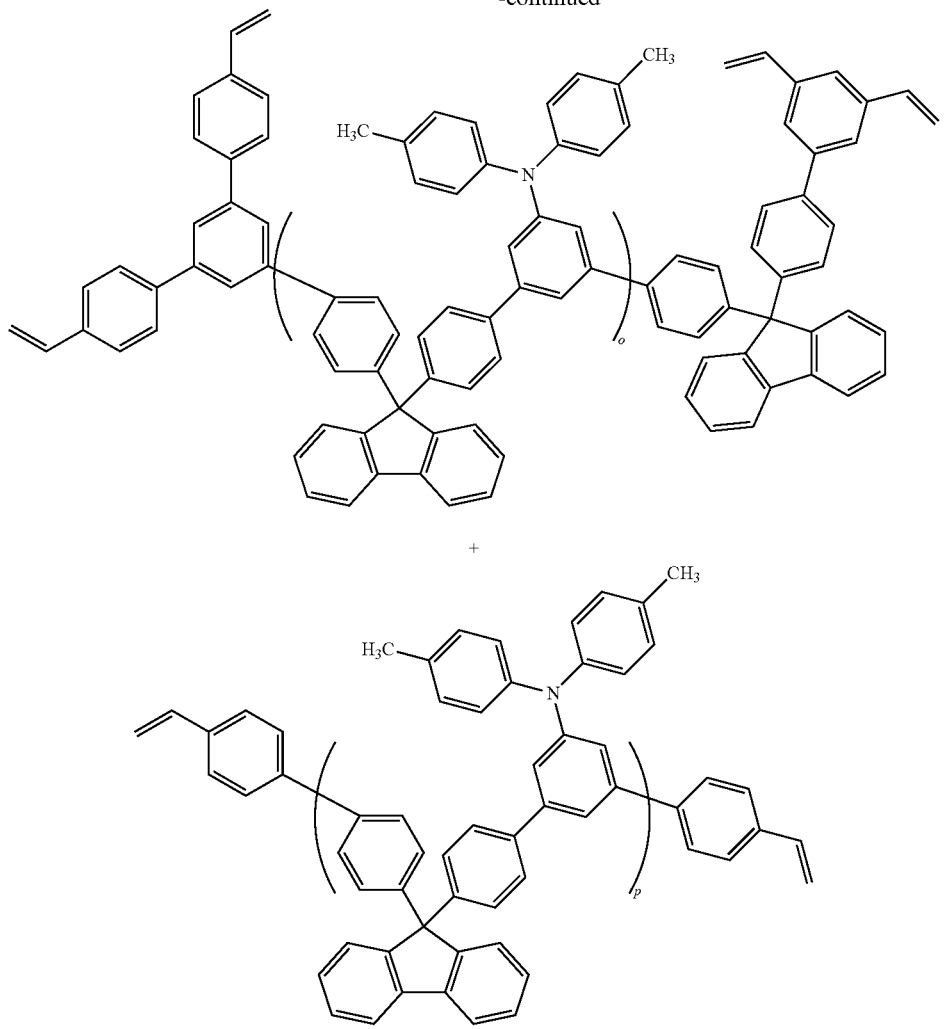

0.431 g (1 mmol) of 3,5-dibromo-N,N-di p-tolylbenzenamine, 0.584 g (1 mmol) of fluoreneboronic acid-pinacolate, 6 mg (0.005 mmol) of tetrakis(triphenylphosphine)palladium, 10 ml of tetraethylammonium hydroxide aqueous solution, 10 ml of toluene, and 10 ml of THF were mixed under a nitrogen atmosphere and agitated at 100° C. for 8 hours.

After cooling to 80° C., 0.315 g of 1,3,5-tribromobenzene was added into the mixed solution and agitated for 2 hours, and then 0.6 g of 4-styreneboronic acid was added and agitated for 4 hours. The resultant was precipitated in 200 ml of methanol to deposit a polymer. The obtained polymer was dissolved in 50 ml of toluene and introduced and reprecipitated in 300 ml of a mixed solution of acetone:ethanol:water (1:1:1 volume ratio). The precipitated polymer was filtered and dissolved in toluene and purified by Florisil column gel permeation chromatography. Thus, 0.8 g of a yellow polymer (7) was obtained. The polymer (7) had a number average molecular weight (Mn) of 24,000.

EXPERIMENTAL EXAMPLE 1

Analysis of Light Emitting Characteristics 0.1 g of each polymer synthesized from Examples 2 and 3 was mixed with 1.14 mL of toluene solvent and spin-coated on a glass substrate to provide a thin film having a thickness of 20 nm.

The polymer coated on the substrate was measured to determine UV/visible absorption and photoluminescence emission wavelength at room temperature (about 25° C.) and to determine a PL (photoluminescence) emission wavelength of solution at a low temperature of 77 K using a UV spectrometer (Shimadzu, UV-1650 PC) and a spectroradiometer (Minolta, CS-1000A).

The polymer (2) (synthesized in Example 2) had absorption wavelengths of 212 nm, 245 nm, and 335 nm, a maximum light emitting wavelength of 409 nm at room temperature, a maximum light emitting wavelength of 389 nm at a low temperature of 77 K, and a phosphorescent maximum light emitting wavelength of 484 nm. Based on the spectroscopic characteristics, the band gap energy of polymer (2) was calculated. The singlet band gap energy was 3.24 eV, and the triplet band gap energy was 2.56 eV.

The polymer (3) (synthesized in Example 3) had absorption wavelengths of 210 nm, 265 nm, and 355 nm, a maximum light emitting wavelength of 414 nm at room temperature, a maximum light emitting wavelength of 396 nm at a low temperature of 77 K, and a phosphorescent maximum light emitting wavelength of 497 nm. Based on the spectroscopic characteristics, the band gap energy of polymer (3) was calculated. The singlet band gap energy was 3.19 eV, and the triplet band gap energy was 2.49 eV.

As noted above, the band gap energy indicates the difference between HOMO (highest occupied molecular orbital) and LUMO (lowest unoccupied molecular orbital). The polymer according to the present embodiment may be usefully applied for an organic thin layer of an organic photoelectric device.

Each polymer synthesized in Examples 4 to 7 was measured for spectroscopic characteristics (UV/visible absorption and photoluminescence emission) under the following conditions.

A solution in which 10 mg of a polymer was dissolved in 1 mL of toluene was filtered by a 0.45 μm PTFE syringe membrane. 0.2 ml of filtrate was spin-coated on a quartz substrate (2 cm×2 cm) at a speed of 2,000 rpm and dried at 80° C. for 10 minutes to provide a thin film having a thickness of 20 nm.

Figure 7:
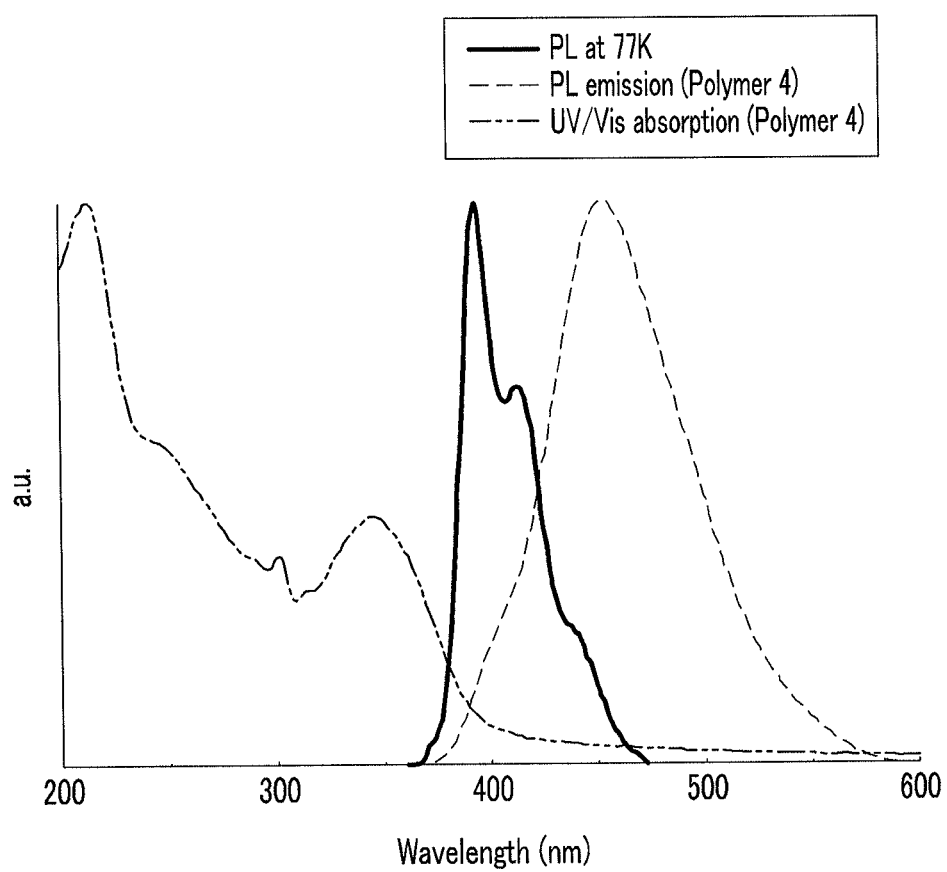
FIG. 7 illustrates a graph showing UV/visible absorption and photoluminescence (PL) emission wavelength of the polymer (4) according to Example 4.
Figure 8:
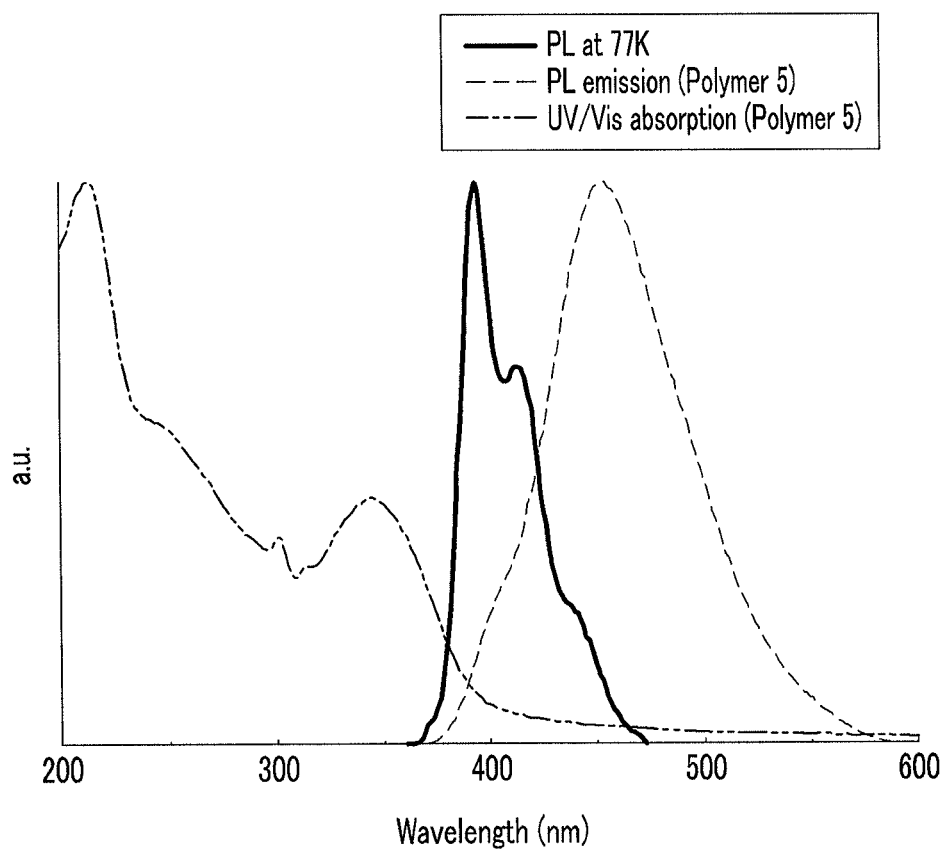
FIG. 8 illustrates a graph showing UV/visible absorption and photoluminescence (PL) emission wavelength of a polymer (5) according to Example 5.
Figure 9:
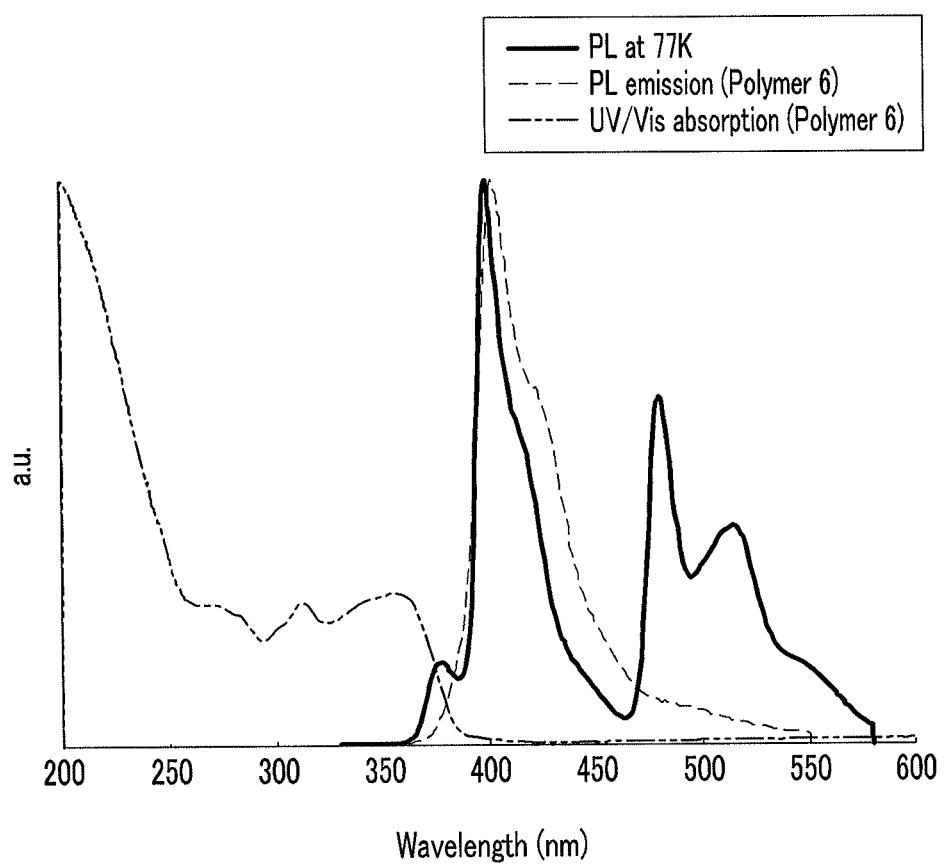
FIG. 9 illustrates a graph showing UV/visible absorption and photoluminescence (PL) emission wavelength of a polymer (6) according to Example 6.

The polymer coated on the substrate was measured for UV/visible absorption and photoluminescent emission wavelength at room temperature (about 25° C.) and for PL (photoluminescence) emission wavelength of solution at a low temperature of 77 K using a UV spectrometer (Shimadzu, UV-1650 PC) and a spectroradiometer (Minolta, CS-1000A). The spectroscopic characteristic results of polymers (4)-(6) obtained from Examples 4 to 6 are shown in FIG. 7 to FIG. 9.

Accordingly, the triplet energy band gap may be calculated. It may be seen that the polymer obtained from Example 6 had triplet energy band gap of 2.7 eV.

EXPERIMENTAL EXAMPLE 2

Analysis of Film Characteristics 10 mg of the polymer obtained from Example 6 was dissolved in 1 mL of xylene and filtered with a 45 μm PTFE syringe membrane, and spin-coated on a glass substrate at a speed of 2,000 rpm. The formed layer was dried at 180° C. for 60 minutes, and the molecular weight was monitored by gel permeation chromatography (GPC). The number average molecular weight (Mn) after forming the layer was 47,000 (which increased by 2.7 times compared to 17,000 before the curing).

Accordingly, it may be seen that the interface stability was enforced due to the cross-linking when the polymer (6) obtained from Example 6 was used as an organic thin layer of an organic photoelectric device.

EXAMPLE 8

Fabrication of Organic Light Emitting Diode

A 15 Ω/cm² (1,200 Å) ITO glass substrate (Corning Inc.) was prepared to have a size of 25 mm×25 mm×0.7 mm to provide a first electrode. The substrate including the first electrode was cleaned using ultrasonic waves in isopropyl alcohol and pure water for 5 minutes, respectively, followed by UV ozone cleaning for 30 minutes.

PEDOT/PSS was spin-coated on the first electrode to provide a hole injection layer (HIL). The polymer (1) of Example 1 was spin-coated on the hole injection layer (HIL).

Subsequently, a host material for the emission layer was a mixture of 4,4',4"-tri(N-carbazolyl)triphenylamine (TCTA) and 3,5-tris(N-phenylbenzimidazol-2-yl)benzene (TPBI) in a weight ratio of 1:1, and the dopant was 13 wt % of tris(2-4 (4-tolyl)phenylpyridine)iridium(Ir(mppy)$_3$), and then it was subjected to spin coating.

Bis(2-methyl-8-quinolinolate)-4-(phenylphenolate)aluminum (BAlq) was vacuum-deposited on the emission layer to provide a 50 Å-thick hole blocking layer. Then tris(8-hydroxy-quinolate)aluminum (Alq$_3$) was vacuum deposited on the hole blocking layer to provide a 200 Å thick electron transport layer (ETL).

An electron injection layer (EIL) of LiF was provided on the electron transport layer at a thickness of 10 Å, and a second electrode of Al was vacuum deposited at a thickness of 1,000 Å to provide an organic light emitting diode.

EXAMPLE 9

Fabrication of Organic Light Emitting Diode

An organic light emitting diode was fabricated according to the same method as Example 8 except for using the polymer (3).

COMPARATIVE EXAMPLE 1

An organic light emitting diode was fabricated according to the same method as Example 8 except that the emission layer was directly formed on the hole injection layer (HIL).

EXPERIMENTAL EXAMPLE 3

Performance of Organic Light Emitting Diode

To find the characteristics of organic light emitting diodes obtained from Examples 8 and 9 and Comparative Example 1, the early driving voltage (turn-on voltage) when starting the device to emit light was measured using a current-voltage meter (Keithley 2400).

In addition, driving voltage (V), luminous efficiency (cd/A), and electrical power efficiency (lm/W) were measured using a luminance meter (Minolta Cs-1000A) when the luminance was 1000 cd/m², and the results are shown in Table 1 of FIG. 12.

As shown in Table 1, it may be seen that the organic light emitting diodes obtained from Examples 8 and 9 respectively had luminous efficiency of 22 cd/A and 18.8 cd/A at 1,000 cd/m², which was improved by 30% or more compared to that of Comparative Example 1. Examples 8 and 9 respectively had electrical power efficiency of 10 lm/W and 8.2 lm/W, respectively, which was increased by 1.6 times or more compared to that of Comparative Example 1.

In addition, it may be seen that the organic light emitting diodes obtained from Examples 8 and 9 had lower driving voltages and superior maximum luminous efficiency and maximum electrical power efficiency, compared to the organic light emitting diode of Comparative Example 1.

EXAMPLE 10

Fabrication of Organic Light Emitting Diode

An organic light emitting diode including the polymer (6) prepared according to Example 6 was fabricated in the following device structure.

A PEDOT:PSS layer was spin-coated on an ITO substrate in a thickness of 60 nm to provide a cathode. The PEDOT:PSS layer was dried at 180° C. for 20 minutes, and the polymer according to Example 3 was spin-coated on an upper surface of the PEDOT:PSS layer to a thickness of 20 nm and dried at 180° C. for 60 minutes.

An emission layer was spin-coated on the upper surface of the layer including the polymer (6) to a thickness of 40 nm. The emission layer was prepared by using a host of a mixture of 4,4',4"-tri(N-carbazolyl)triphenylamine:2-tert-butylphenyl-5-biphenyl-1,3,4'-oxadiazole (TCTA:PBD=1:1) and doping with an Ir(PPy)$_2$(acac) dopant at 5 wt % based on the total amount of the emission layer. The formed emission layer was dried at 110° C. for 10 minutes.

BAlq was vacuum deposited on the emission layer to provide a 5 nm-thick hole blocking layer. Then Alq was vacuum deposited on the upper surface of the emission layer to provide an electron transport layer (ETL) having a thickness of 20 nm.

LiF and Al were sequentially vacuum-deposited respective thicknesses of 1 nm and 100 nm for an anode on the upper of electron transport layer (ETL) to fabricate an organic light emitting diode.

COMPARATIVE EXAMPLE 2

An organic light emitting diode including no polymer according to Example 6 was fabricated in the following device structure.

A PEDOT:PSS layer was spin-coated on the upper surface of an ITO substrate to a thickness of 60 nm to provide a cathode. The PEDOT:PSS layer was dried at 180° C. for 20 minutes.

An emission layer was spin-coated on the upper surface of the PEDOT:PSS layer to a thickness of 40 nm. The emission layer was prepared by using a host of mixture of 4,4',4''-tri(N-carbazolyl)triphenylamine:2-tert-butylphenyl-5-biphenyl-1,3,4'-oxadiazole (TCTA:PBD=1:1) and a dopant of Ir(PPy)$_2$(acac) at 5 wt % based on the total amount of the emission layer. The formed emission layer was dried at 110° C. for 10 minutes.

BAlq was vacuum deposited on the emission layer to provide a 5 nm-thick hole blocking layer. Subsequently, Alq was vacuum deposited on the upper surface of the emission layer to provide a 20 nm-thick electron transport layer (ETL).

LiF and Al were sequentially vacuum-deposited at respective thicknesses of 1 nm and 100 nm for an anode on the upper of electron transport layer (ETL) to fabricate an organic light emitting diode.

EXPERIMENTAL EXAMPLE 4

Characteristics of Organic Light Emitting Diode

1) Driving Voltage, Luminance, and Luminous Efficiency

Each organic light emitting diode obtained from Example 10 and Comparative Example 2 was measured for driving voltage (V) required for brightness of 2,000 cd/cm$^2$, current efficiency (cd/A), and electrical power efficiency (lm/W) for the same brightness, and the results are shown in Table 2. In addition, the turn-on voltage refers to the voltage at the moment when the organic light emitting diode starts to emit light, and the results are shown in Table 2, below.

2) Luminance Change Depending Upon Current Density

Figure 10:
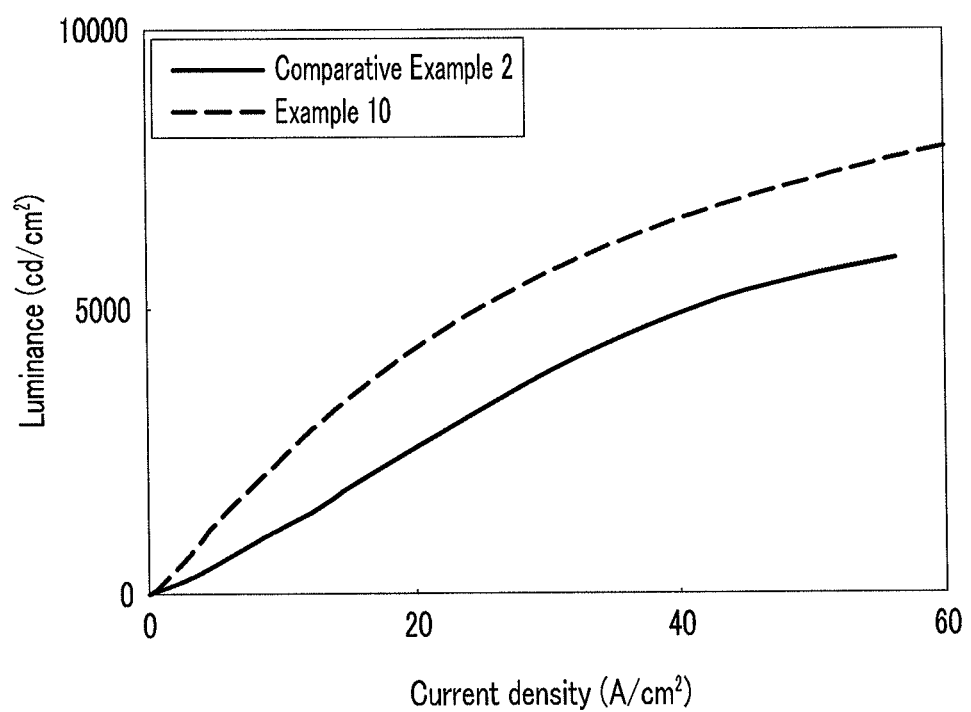
FIG. 10 illustrates a graph showing luminance-current density of organic light emitting diodes including polymers according to Example 10 and Comparative Example 2.

The current flowing though the unit device was measured using a current-voltage meter (Keithley 2400). The current density was calculated by dividing the measured current value by the area of the organic light emitting diode. Each organic light emitting diode obtained from the Example 10 and Comparative Example 2 was measured for luminance change depending upon current density, and the results are shown in FIG. 10.

3) Current Efficiency Change Depending Upon Luminance

Figure 11:
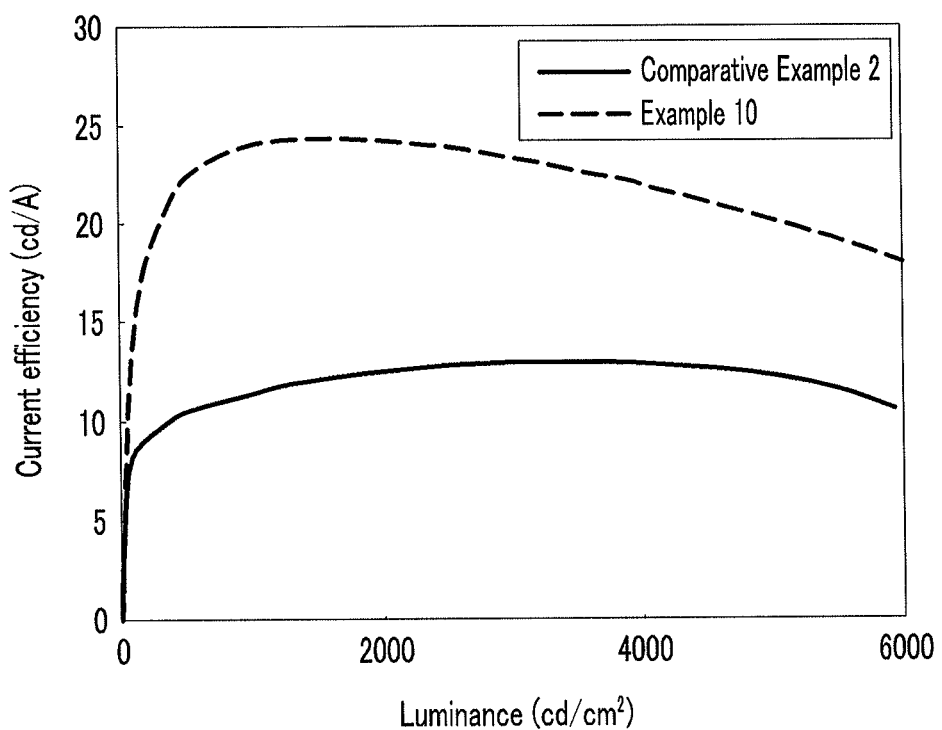
FIG. 11 illustrates a graph showing luminance-current efficiency of organic light emitting diodes including the polymers according to Example 10 and Comparative Example 2.

The luminance was measured using a luminance meter (Minolta Cs-1000A), and each organic light emitting diode according to Example 5 and Comparative Example 1 was measured for current efficiency change depending upon luminance, and the results are shown in FIG. 11.

TABLE 2

| | At light emitting luminance of 2,000 cd/cm$^2$ | | | | |
| --- | --- | --- | --- | --- | --- |
| | Turn-on voltage | Driving voltage | Current efficiency | Electrical power efficiency | Color coordinate |
| Comparative Example 2 | 6.4 V | 11.5 V | 12.5 cd/A | 3.4 lm/W | 0.29, 0.60 |
| Example 10 | 6.0 V | 10.6 V | 24.2 cd/A | 7.2 lm/W | 0.30, 0.61 |

It may be seen that the organic light emitting diode according to Example 10 decreased the driving voltage and improved current efficiency by 94% and improved the electrical power efficiency by 112%, compared to the organic light emitting diode according to Comparative Example 2 (including no polymer).

By way of summation and review, a hydrophilic poly(3,4-ethylene dioxythiophene)/poly (4-styrenesulfonate) (PEDOT/PSS) layer may be used for a hole injection layer (HIL). However, the hydrophilic hole injection layer (HIL) may deteriorate interface characteristics when stacked together with a hydrophobic emission layer. In addition, the cathode and the emission layer may be damaged due to PEDOT/PSS having inherent acidic material characteristics after the passage of time. Thus, the luminous efficiency and life-span characteristics of the device may be deteriorated.

The material for a wet process may include other polymer materials. The polymer materials may have long aromatic substituents such as an aryl group, an arylamine group, and the like, that are connected by a covalent bond. Generally, a conjugated length may be elongated when the molecule length is elongated, and thus, a molecular energy band gap may be decreased. Even in the case of using the same monomer, various polymer materials having different energy band gaps may be synthesized, depending upon the polymerization degree. Accordingly, a polymer material having various molecular weight distributions may be synthesized even in one reaction group so it may be very difficult to provide an organic thin layer having a predetermined or predictable energy band gap.

Accordingly, the embodiments provide a polymer (having excellent interface stability and that is capable of adjusting the energy band gap) applicable by using a wet process (having merits in the views of process, cost, and large-sized display), in order to provide an organic photoelectric device having excellent life-span and efficiency characteristics.

An embodiment provides a polymer having excellent interface stability for an organic thin layer and being capable of easily controlling an energy band gap.

Another embodiment provides an organic photoelectric device having excellent life-span and efficiency characteristics.

The polymer according to an embodiment may have a desired energy band gap regardless of the polymerization degree of the polymer. In addition, the polymer may include a cross-linkable functional group at a terminal end thereof, so the organic thin layer may be cross-linked to enforce layer interface stability.

In addition, the polymer may have excellent hole-injecting and transporting characteristics and an energy band gap suitable for providing a step of energy level between organic thin layers, so that the performance of an organic photoelectric device is further improved. Furthermore, an organic photoelectric device according to an embodiment may have excellent life-span and efficiency characteristics by preventing eluting or eroding of other organic thin layer due to the solvent during the wet process.

Example embodiments have been disclosed herein, and although specific terms are employed, they are used and are to be interpreted in a generic and descriptive sense only and not for purpose of limitation. Accordingly, it will be understood by those of skill in the art that various changes in form and details may be made without departing from the spirit and scope of the present invention as set forth in the following claims.

What is claimed is:

1. A polymer including a repeating unit represented by the following Chemical Formula 1:

[Chemical Formula 1]

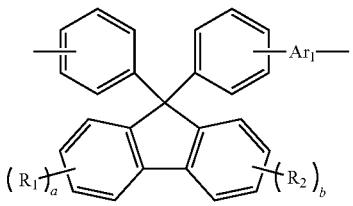

wherein, in the above Chemical Formula 1, $Ar_1$ is a divalent organic group including one of a C1 to C60 substituted or unsubstituted alkylene group, a nitrogen-containing C1 to C60 substituted or unsubstituted heteroalkylene group, a C6 to C60 substituted or unsubstituted arylene group, a nitrogen-containing C3 to C60 substituted or unsubstituted heteroarylene group, and a C6 to C60 substituted or unsubstituted arylamine group, $R_1$ and $R_2$ are each independently one of hydrogen, a C1 to C30 substituted or unsubstituted alkyl group, and a C6 to C30 substituted or unsubstituted aryl group, and a and b are each independently integers of 0 to 4.

2. The polymer as claimed in claim 1, wherein $Ar_1$ is a substituent represented by one of the following Chemical Formulae 2 to 5:

[Chemical Formula 2]

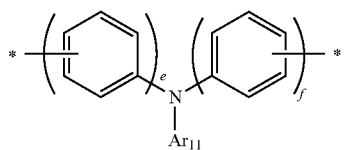

[Chemical Formula 3]

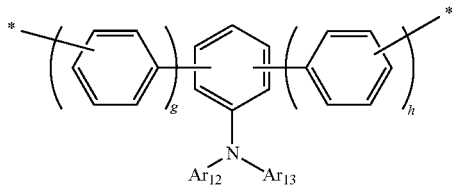

[Chemical Formula 4]

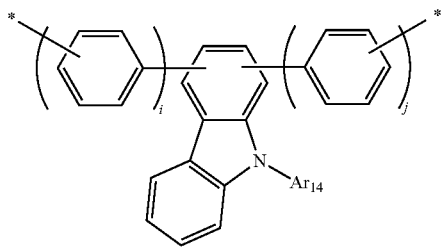

[Chemical Formula 5]

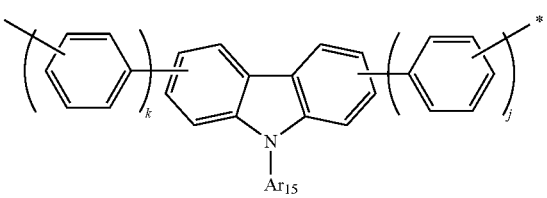

wherein, in the above Chemical Formulae 2 to 5, $Ar_{11}$ to $Ar_{15}$ are each independently one of hydrogen, a halogen, a cyano group, a hydroxyl group, an amino group, a nitro group, a carboxyl group, a substituted or unsubstituted C1 to C20 alkyl group, a substituted or unsubstituted C2 to C50 alkenyl group, a substituted or unsubstituted C3 to C50 cycloalkyl group, a substituted or unsubstituted C1 to C50 heterocycloalkyl group, a substituted or unsubstituted C6 to C50 aryl group, a substituted or unsubstituted C3 to C50 heteroaryl group, a substituted or unsubstituted C6 to C50 arylamine group, a substituted or unsubstituted C1 to C50 alkoxy group, a substituted or unsubstituted C6 to C50 aryloxy group, a substituted or unsubstituted C2 to C50 heteroaryloxy group, a substituted or unsubstituted C3 to C50 silyloxy group, a substituted or unsubstituted C1 to C50 acyl group, a substituted or unsubstituted C2 to C50 alkoxycarbonyl group, a substituted or unsubstituted C2 to C50 acyloxy group, a substituted or unsubstituted C2 to C50 acylamino group, a substituted or unsubstituted C2 to C50 alkoxycarbonylamino group, a substituted or unsubstituted C7 to C50 aryloxycarbonylamino group, a substituted or unsubstituted C1 to C50 sulfamoylamino group, a substituted or unsubstituted C1 to C50 sulfonyl group, a substituted or unsubstituted C1 to C50 alkylthiol group, a substituted or unsubstituted C6 to C50 arylthiol group, a substituted or unsubstituted C1 to C50 heterocycloalkylthiol group, a substituted or unsubstituted C1 to C50 ureide group, a substituted or unsubstituted C1 to C50 phosphoric acid amide group, a substituted or unsubstituted C3 to C50 silyl group, and fused rings thereof, and e, f, g, h, i, j, k, and l are each independently an integer of 0 to 4.

3. The polymer as claimed in claim 2, wherein $Ar_{11}$ to $Ar_{15}$ are each independently one of a substituted or unsubstituted C3 to C30 cycloalkyl group, a substituted or unsubstituted C1 to C30 heterocycloalkyl group, a substituted or unsubstituted C6 to C30 aryl group, a substituted or unsubstituted C3 to C30 heteroaryl group, a substituted or unsubstituted C6 to C30 arylamine group, and fused rings thereof.

4. The polymer as claimed in claim 1, wherein $Ar_1$ is a substituent represented by one of the following Chemical Formulae 19 and 20:

[Chemical Formula 19]

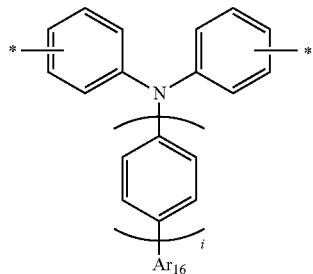

[Chemical Formula 20]

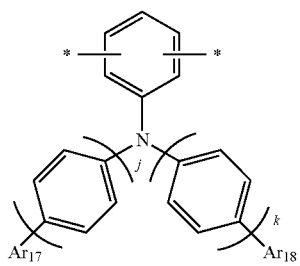

wherein, in the above Chemical Formulae 19 and 20, $Ar_{16}$ to $Ar_{18}$ are each independently one of hydrogen, a substituted or unsubstituted phenyl group, a substituted or unsubstituted biphenyl group, a substituted or unsubstituted terphenyl group, a substituted or unsubstituted fluorene group, a substituted or unsubstituted carbazole group, a substituted or unsubstituted benzimidazole group, and a substituted or unsubstituted arylamine group, and i, j, and k are each independently 0 or 1.

5. The polymer as claimed in claim 1, further comprising a cross-linkable functional group at a terminal end thereof.

6. The polymer as claimed in claim 5, wherein the cross-linkable functional group includes one of a substituted or unsubstituted alkenyl group, a substituted or unsubstituted (meth)acryl group, a substituted or unsubstituted epoxy group, a substituted or unsubstituted styrene group, and a substituted or unsubstituted alkoxy group.

7. The polymer as claimed in claim 1, wherein the polymer has a difference of about 2.4 eV or more between a highest occupied molecular orbital (HOMO) and a lowest unoccupied molecular orbital (LUMO).

8. The polymer as claimed in claim 1, wherein the repeating unit represented by Chemical Formula 1 is one of the following Chemical Formulae 6 to 18:

[Chemical Formula 6]

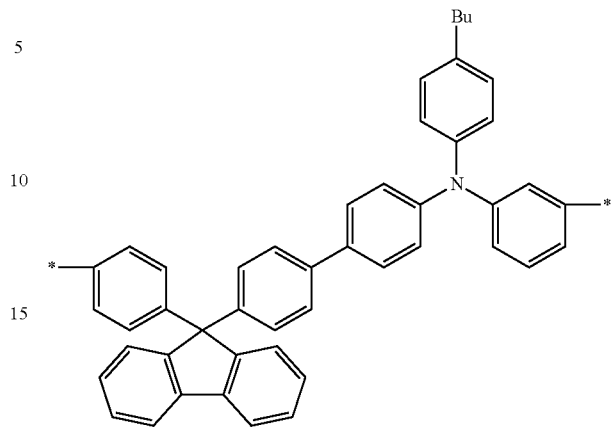

[Chemical Formula 7]

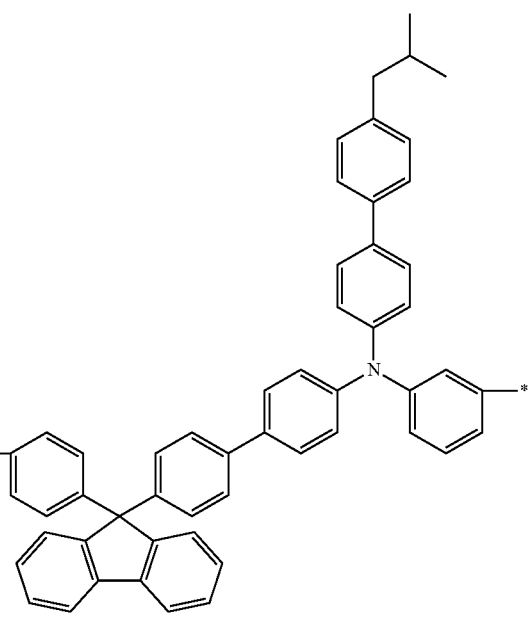

[Chemical Formula 8]

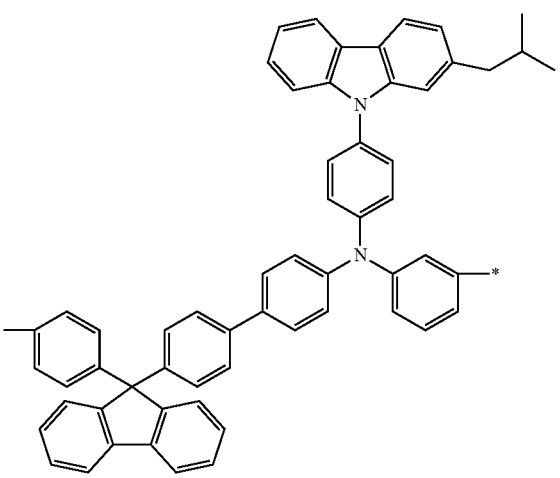

[Chemical Formula 9]
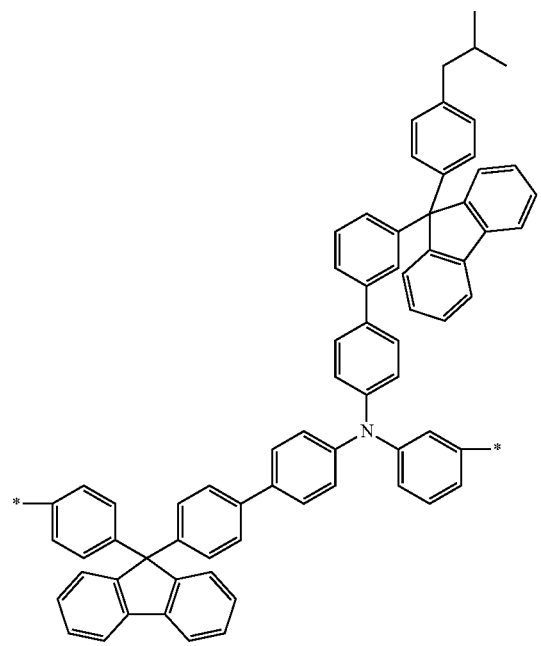
[Chemical Formula 10]
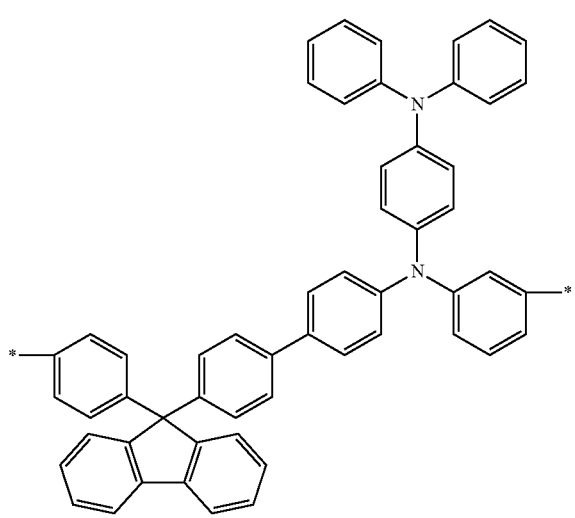
[Chemical Formula 11]
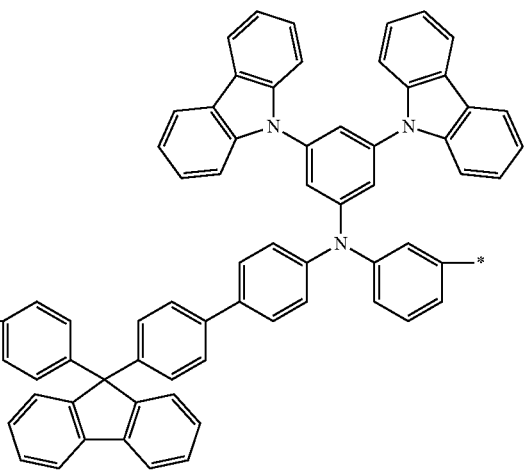
[Chemical Formula 12]
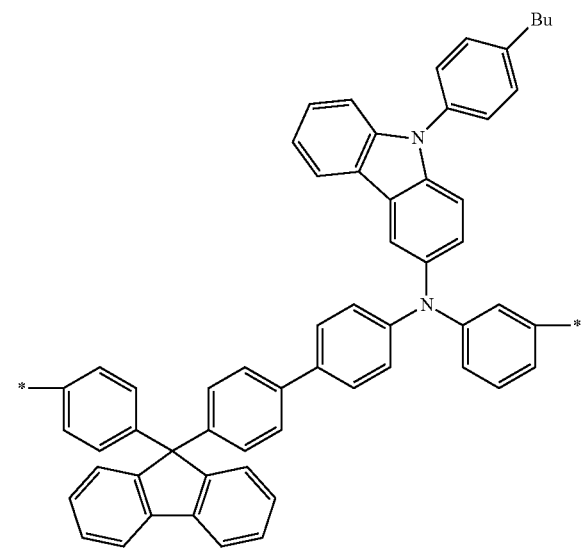
[Chemical Formula 13]
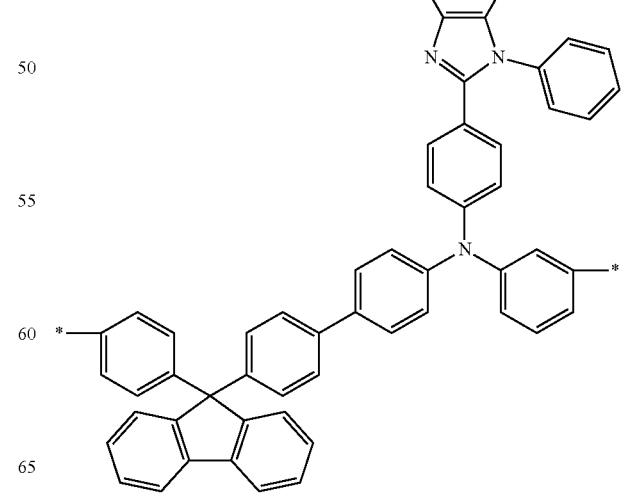

[Chemical Formula 14]

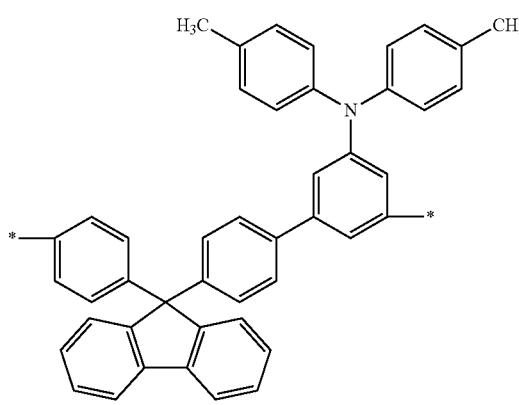

[Chemical Formula 15]

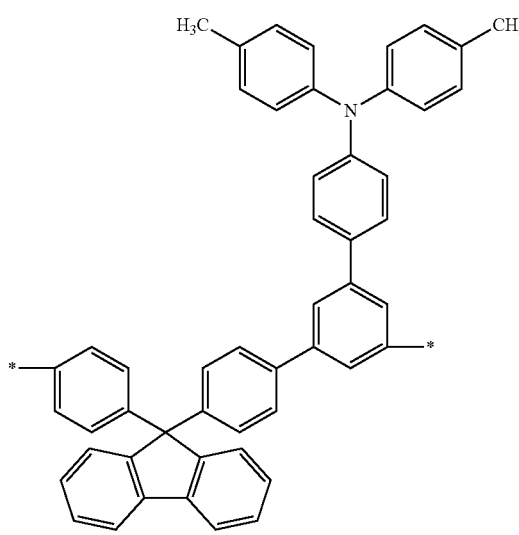

[Chemical Formula 16]

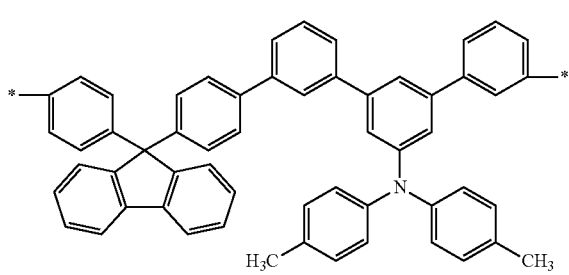

[Chemical Formula 17]

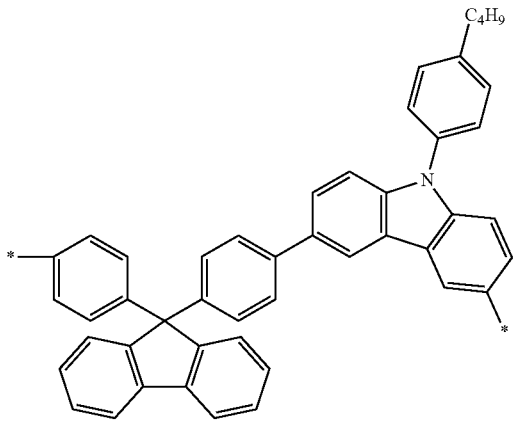

[Chemical Formula 18]

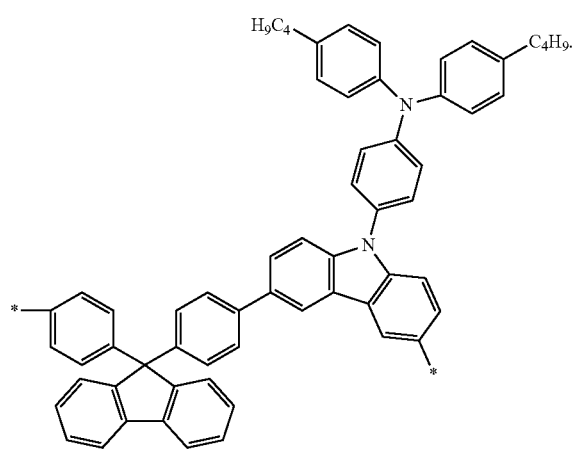

9. An organic photoelectric device, comprising:
   an anode,
   a cathode, and
   at least one organic thin layer between the anode and cathode, the organic thin layer including the polymer as claimed in claim 1.

10. The organic photoelectric device as claimed in claim 9, wherein the polymer is a host material or a charge-transporting material.

11. The organic photoelectric device as claimed in claim 9, wherein the polymer is included in a hole transport layer.

12. The organic photoelectric device as claimed in claim 9, wherein the organic thin layer is an emission layer, a hole transport layer (HTL), a hole injection layer (HIL), a hole inhibition layer, an electron transport layer (ETL), an electron injection layer (EIL), an electron inhibition layer, or a combination thereof.

13. A display device comprising the organic photoelectric device as claimed in claim 9.

* * * * *